(12) United States Patent
Wei et al.

(10) Patent No.: US 10,375,835 B2
(45) Date of Patent: *Aug. 6, 2019

(54) METHODS OF TREATING METAL SURFACES AND DEVICES FORMED THEREBY

(71) Applicant: Atotech Deutschland GmbH, Berlin (DE)

(72) Inventors: Jen-Chieh Wei, Highlands Ranch, CO (US); Zhiming Liu, Englewood, CO (US); Steven Z. Shi, Santa Clara, CA (US); Werner G. Kuhr, Denver, CO (US)

(73) Assignee: Atotech Deutchland GmbH, Berlin (DE)

( * ) Notice: Subject to any disclaimer, the term of this patent is extended or adjusted under 35 U.S.C. 154(b) by 282 days.

This patent is subject to a terminal disclaimer.

(21) Appl. No.: 15/238,881

(22) Filed: Aug. 17, 2016

(65) Prior Publication Data

US 2016/0360623 A1 Dec. 8, 2016

Related U.S. Application Data

(63) Continuation of application No. 14/009,517, filed as application No. PCT/US2010/041061 on Jul. 6, 2010.
(Continued)

(51) Int. Cl.
*C23C 8/12* (2006.01)
*C23C 22/63* (2006.01)
(Continued)

(52) U.S. Cl.
CPC ............... *H05K 3/385* (2013.01); *C08J 5/12* (2013.01); *C09J 5/02* (2013.01); *C23C 8/12* (2013.01);
(Continued)

(58) Field of Classification Search
CPC ........ H05K 3/385; H05K 3/386; H05K 3/388; H05K 3/387; H05K 2203/0315;
(Continued)

(56) References Cited

U.S. PATENT DOCUMENTS 2,364,993 A 12/1944 Meyer
2,460,896 A 2/1949 Meyer
(Continued)

FOREIGN PATENT DOCUMENTS

| CN | 1063989 | 8/1992 |
| WO | 9902452 | 1/1999 |
| WO | 2005086826 | 9/2005 |

OTHER PUBLICATIONS

PCT/US2010/041061; PCT International Search Report of the International Searching Authority dated Aug. 21, 2010.
(Continued)

*Primary Examiner* — Lois L Zheng
(74) *Attorney, Agent, or Firm* — Renner, Otto, Boisselle & Sklar, LLP

(57) ABSTRACT

The present invention relates to methods of treating metal surfaces to enhance adhesion or binding to substrates, and devices formed thereby. In some embodiments of the present invention, methods of achieving improved bonding strength without roughening the topography of a metal surface are provided. The metal surface obtained by this method provides strong bonding to resin layers. The bonding interface between the treated metal and the resin layer exhibits resistance to heat, moisture, and chemicals involved in post-lamination process steps, and therefore can suitably be used in the production of PCB's. Methods according to some embodiments of the present invention are especially useful in the fabrication of high density multilayer PCB's, in particular for PCB's having circuits with line/spacing of equal to and less than 10 microns. Methods according to
(Continued)

other embodiments of the present invention are particularly useful in the coating of metal surfaces in a wide variety of applications.

22 Claims, 19 Drawing Sheets

Related U.S. Application Data

(60) Provisional application No. 61/270,347, filed on Jul. 6, 2009.

(51) Int. Cl.
| | |
|---|---|
| H05K 3/38 | (2006.01) |
| C23C 8/16 | (2006.01) |
| C23C 22/83 | (2006.01) |
| C09J 5/02 | (2006.01) |
| C08J 5/12 | (2006.01) |
| C23C 8/40 | (2006.01) |
| C23C 8/80 | (2006.01) |
| H05K 3/46 | (2006.01) |

(52) U.S. Cl.
CPC .............. *C23C 8/16* (2013.01); *C23C 8/40* (2013.01); *C23C 8/80* (2013.01); *C23C 22/63* (2013.01); *C23C 22/83* (2013.01); *C08J 2363/00* (2013.01); *C09J 2400/163* (2013.01); *C09J 2400/166* (2013.01); *C09J 2400/20* (2013.01); *H05K 3/389* (2013.01); *H05K 3/4673* (2013.01); *H05K 2203/0315* (2013.01); *H05K 2203/065* (2013.01); *H05K 2203/1157* (2013.01)

(58) Field of Classification Search
CPC .. C23C 8/12; C23C 8/16; C23C 22/52; C23C 22/63; C23C 22/83
See application file for complete search history.

(56) References Cited

U.S. PATENT DOCUMENTS

| | | | |
|---|---|---|---|
| 2,460,898 A | 2/1949 | Meyer | |
| 2,955,974 A | 10/1960 | Allen et al. | |
| 3,177,103 A | 4/1965 | Tally et al. | |
| 3,198,672 A | 8/1965 | De Hart | |
| 3,240,662 A | 3/1966 | Smyers et al. | |
| 3,374,129 A | 3/1968 | Boucher | |
| 3,434,889 A | 3/1969 | Haroldson et al. | |
| 3,481,777 A | 12/1969 | Spannhake | |
| 3,544,389 A | 12/1970 | Vazirani | |
| 3,677,828 A | 7/1972 | Caule | |
| 3,833,433 A | 9/1974 | Caule | |
| 4,409,037 A | 10/1983 | Landau | |
| 4,512,818 A | 4/1985 | Valayil et al. | |
| 4,642,161 A | 2/1987 | Akahoshi et al. | |
| 4,702,793 A | 10/1987 | Garlough et al. | |
| 4,717,439 A | 1/1988 | Hajdu et al. | |
| 4,775,444 A | 10/1988 | Cordani | |
| 4,844,981 A | 7/1989 | Landau | |
| 5,006,200 A | 4/1991 | Chen | |
| 5,492,595 A | 2/1996 | Carano et al. | |
| 5,532,094 A | 7/1996 | Arimura et al. | |
| 5,700,389 A | 12/1997 | Nakagawa | |
| 5,721,014 A | 2/1998 | Fakler et al. | |
| 5,736,065 A | 4/1998 | Nakaso et al. | |
| 5,750,087 A | 5/1998 | Corella, II et al. | |
| 5,753,309 A | 5/1998 | Fakler et al. | |
| 5,800,859 A | 9/1998 | Price et al. | |
| 5,807,493 A | 9/1998 | Maki et al. | |
| 5,869,130 A | 2/1999 | Ferrier | |
| 5,885,476 A | 3/1999 | Hong et al. | |
| 5,965,036 A | 10/1999 | Maki et al. | |
| 6,208,553 B1 | 3/2001 | Gryko et al. | |
| 6,212,093 B1 | 4/2001 | Lindsey | |
| 6,272,038 B1 | 8/2001 | Clausen et al. | |
| 6,324,091 B1 | 11/2001 | Gryko et al. | |
| 6,381,169 B1 | 4/2002 | Bocian et al. | |
| 6,426,020 B1 | 7/2002 | Okada et al. | |
| 6,451,942 B1 | 9/2002 | Li et al. | |
| 6,554,948 B1 | 4/2003 | Ferrier | |
| 6,642,376 B2 | 11/2003 | Lindsey et al. | |
| 6,657,884 B2 | 12/2003 | Bocian et al. | |
| 6,674,121 B2 | 1/2004 | Misra et al. | |
| 6,716,281 B2 | 4/2004 | Bernards et al. | |
| 6,728,129 B2 | 4/2004 | Lindsey et al. | |
| 6,746,621 B2 | 6/2004 | Kurii et al. | |
| 6,777,516 B2 | 8/2004 | Li et al. | |
| 6,946,027 B2 | 9/2005 | Bernards et al. | |
| 7,108,795 B2 | 9/2006 | Bernards et al. | |
| 7,211,204 B2 | 5/2007 | Bernards et al. | |
| 7,351,353 B1 | 4/2008 | Bernards et al. | |
| 2001/0026120 A1 | 10/2001 | Fukuyoshi et al. | |
| 2002/0010589 A1 | 1/2002 | Nashida et al. | |
| 2002/0076714 A1 | 6/2002 | Kuhr et al. | |
| 2002/0132056 A1* | 9/2002 | Montano | C09D 4/00 427/402 |
| 2002/0154535 A1 | 10/2002 | Bocian et al. | |
| 2002/0180446 A1 | 12/2002 | Kuhr et al. | |
| 2003/0081463 A1 | 5/2003 | Bocian et al. | |
| 2003/0082444 A1 | 5/2003 | Kuhr et al. | |
| 2003/0111670 A1 | 6/2003 | Misra et al. | |
| 2003/0169618 A1 | 9/2003 | Lindsey et al. | |
| 2004/0115524 A1 | 6/2004 | Misra et al. | |
| 2004/0120180 A1 | 6/2004 | Rotenberg et al. | |
| 2004/0150465 A1 | 8/2004 | Nishida et al. | |
| 2004/0161545 A1 | 8/2004 | Montano et al. | |
| 2004/0190429 A1 | 9/2004 | McCreery | |
| 2004/0231141 A1 | 11/2004 | Nishinaka et al. | |
| 2004/0254383 A1 | 12/2004 | Yu et al. | |
| 2005/0019500 A1 | 1/2005 | Bocian et al. | |
| 2005/0041494 A1 | 2/2005 | Bocian et al. | |
| 2005/0056616 A1 | 3/2005 | Cooper et al. | |
| 2005/0062097 A1 | 3/2005 | Misra et al. | |
| 2005/0139254 A1 | 6/2005 | McCreery | |
| 2005/0162895 A1 | 7/2005 | Kuhr et al. | |
| 2005/0185447 A1 | 8/2005 | Kuhr et al. | |
| 2005/0207208 A1 | 9/2005 | Bocian et al. | |
| 2005/0243597 A1 | 11/2005 | Gallo et al. | |
| 2005/0270820 A1 | 12/2005 | Mobley et al. | |
| 2006/0081950 A1 | 4/2006 | Kuhr et al. | |
| 2006/0092687 A1 | 5/2006 | Kuhr et al. | |
| 2006/0195296 A1 | 8/2006 | Petrich et al. | |
| 2006/0209587 A1 | 9/2006 | Bocian et al. | |
| 2007/0108438 A1 | 5/2007 | Lindsey et al. | |
| 2008/0280047 A1 | 11/2008 | Bocian et al. | |
| 2009/0056991 A1 | 3/2009 | Kuhr et al. | |

OTHER PUBLICATIONS

PCT/US2010/041061; PCT International Preliminary Report on Patentability dated Jan. 8, 2013.
Co-pending U.S. Appl. No. 14/009,517, filed May 19, 2014.
Co-pending U.S. Appl, No. 14/280,540, filed May 16, 2014.
Official Action for corresponding Chinese Application No. 2016108322572 dated Aug. 16, 2018.

* cited by examiner

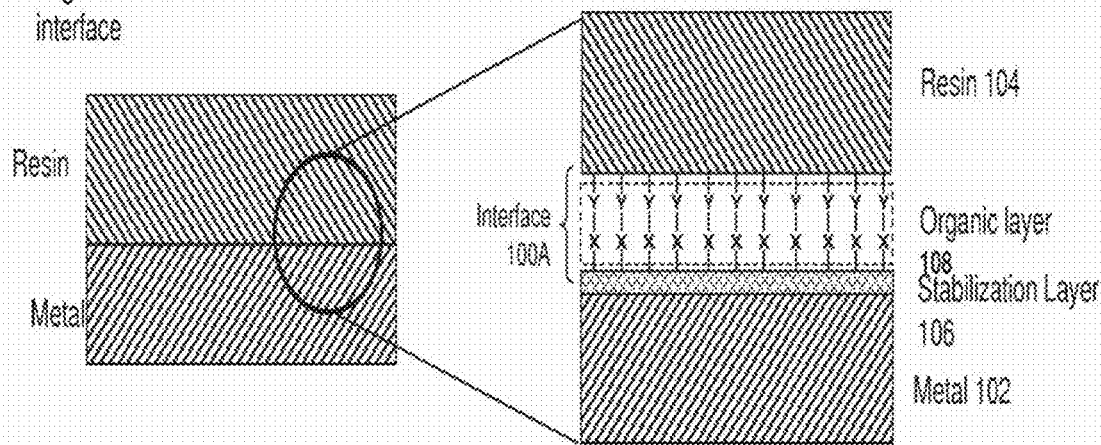
Fig. 1A Treated smooth metal-resin interface
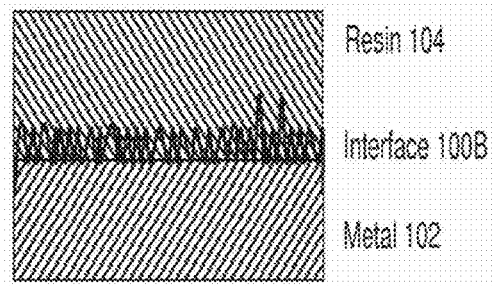
Fig. 1B Roughened metal-resin interface

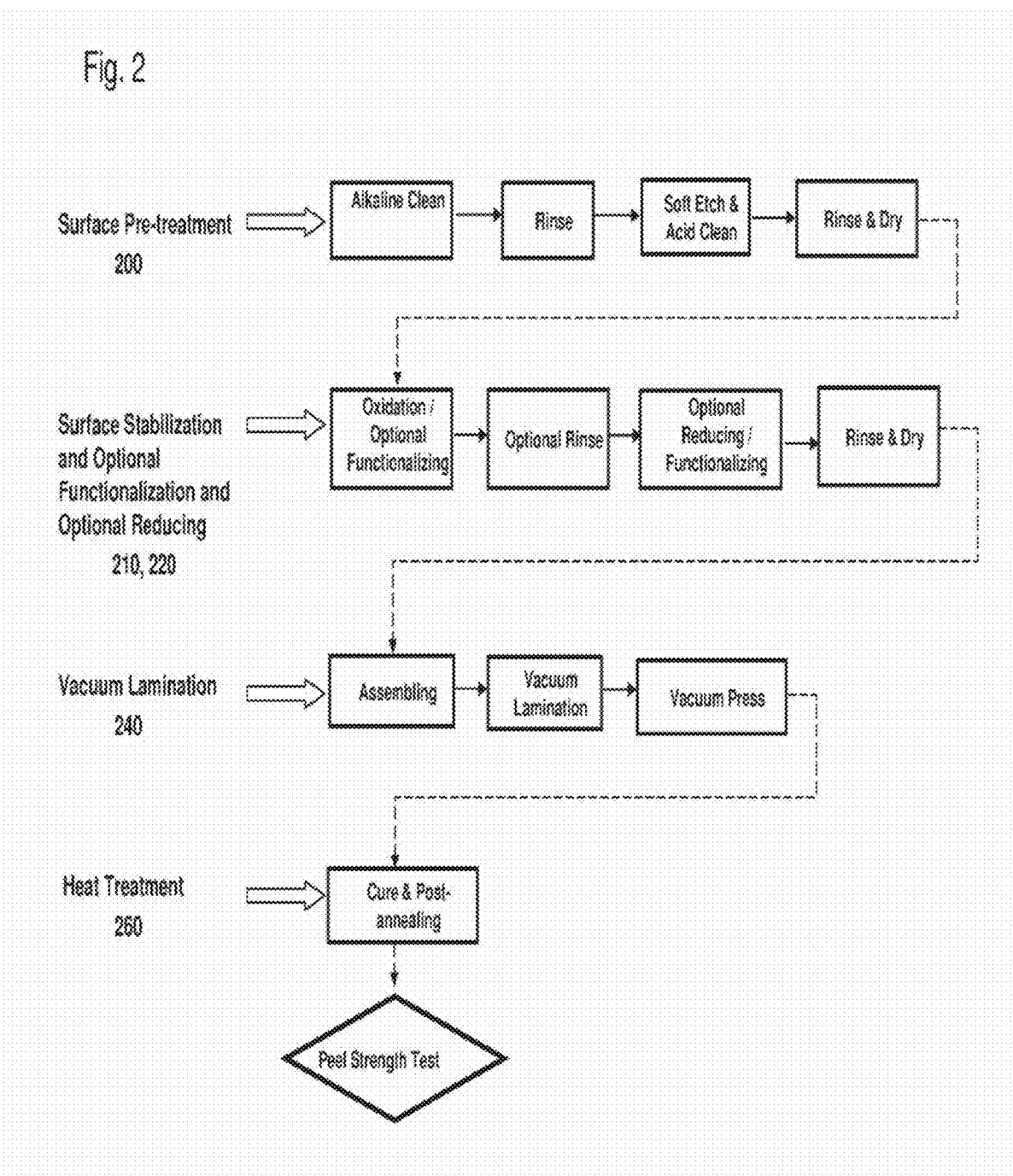

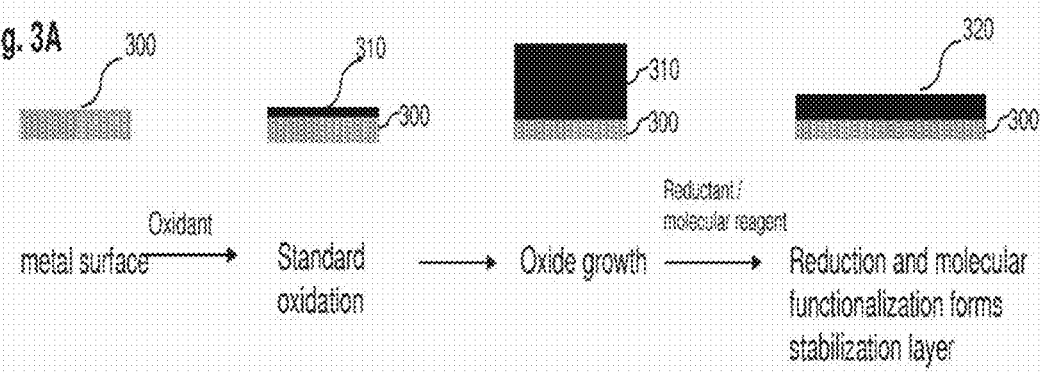
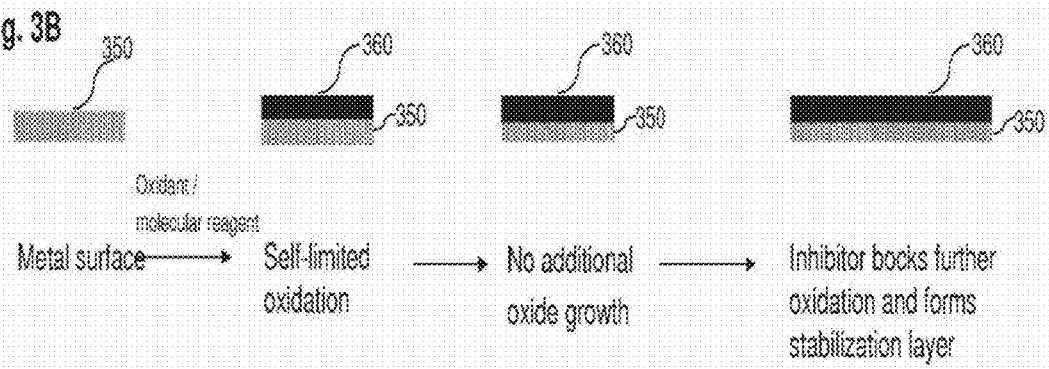

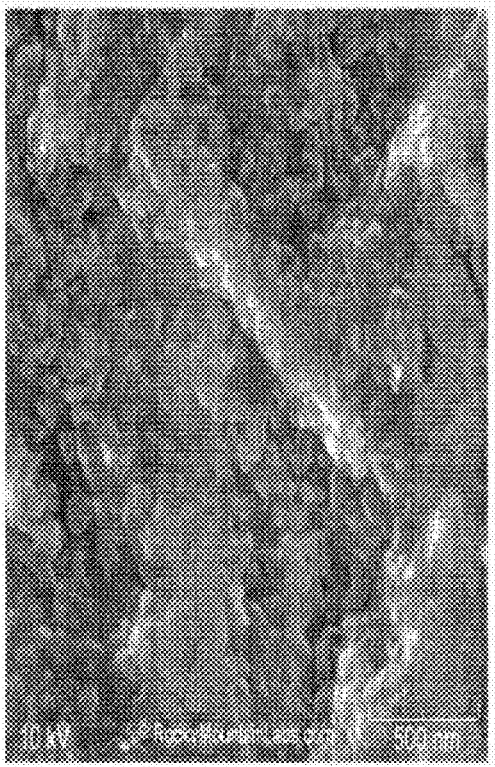
Fig. 4A As-plated smooth Cu (control)
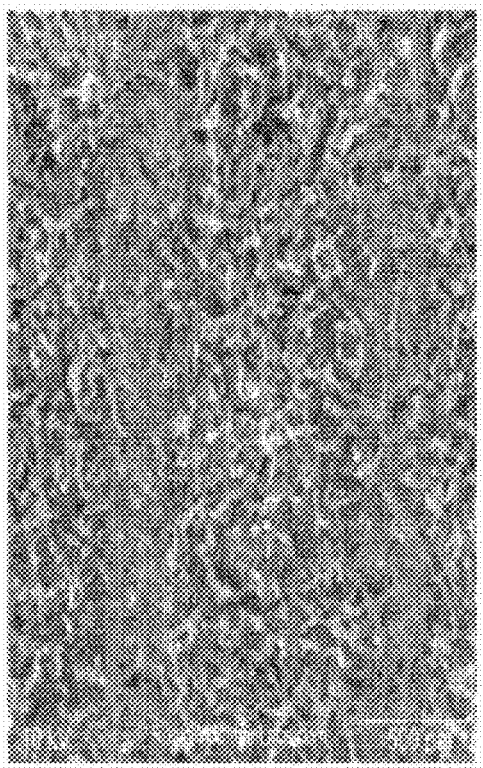
Fig. 4B Treated smooth Cu

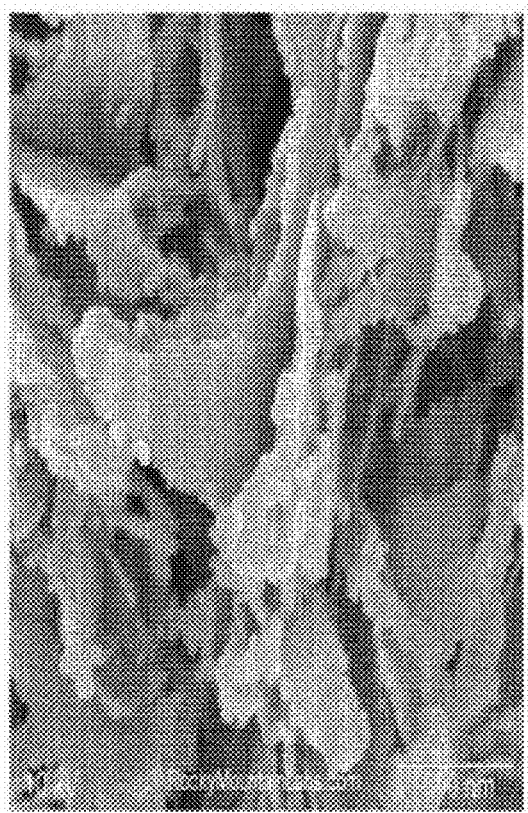
Fig. 4C Conventional rough black oxide surface
Fig. 4D Conventional micro-etched rough copper surface

| Roughness | As-plated smooth Cu | Treated smooth Cu | Black oxide roughened Cu | Micro-etch roughened Cu |
|---|---|---|---|---|
| Ra (μm) | 0.13 | 0.14 | 0.49 | 0.47 |
| Rz (μm) | 1.31 | 1.45 | 5.20 | 4.50 |

Fig. 5

FIG. 8A Tack BU epoxy and remove carrier film

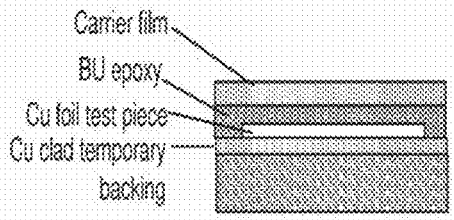

Carrier film
BU epoxy
Cu foil test piece
Cu clad temporary backing

Remove cover film from one side of BU epoxy and laminate to sample and temporary backing by:
1. Vacuum lamination at 100 °C, 30 s vacuum, 30 s press, 3 Kg/cm²
2. Cool and remove carrier film
3. Repeat 1 and 2 for two times (total 3 plies of BU film)

FIG 8B. Laminate backing substrate

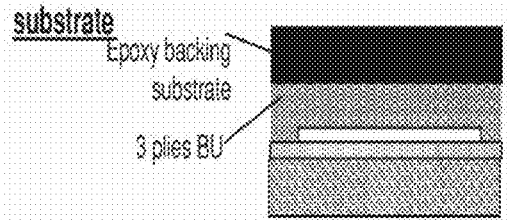

Epoxy backing substrate
3 plies BU

Laminate epoxy backing substrate (stiffener) by vacuum lamination at 100 °C, 30 s vacuum, 60 s press, 3 Kg/cm²

FIG. 8C Cure BU epoxy

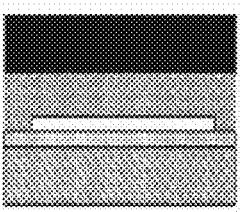

Cure in convection oven at 180 °C for 90 minutes

FIG 8D. Separate test specimens

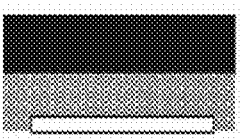

Remove temporary backing, separate into individual test specimens, and prepare for peel test and HAST

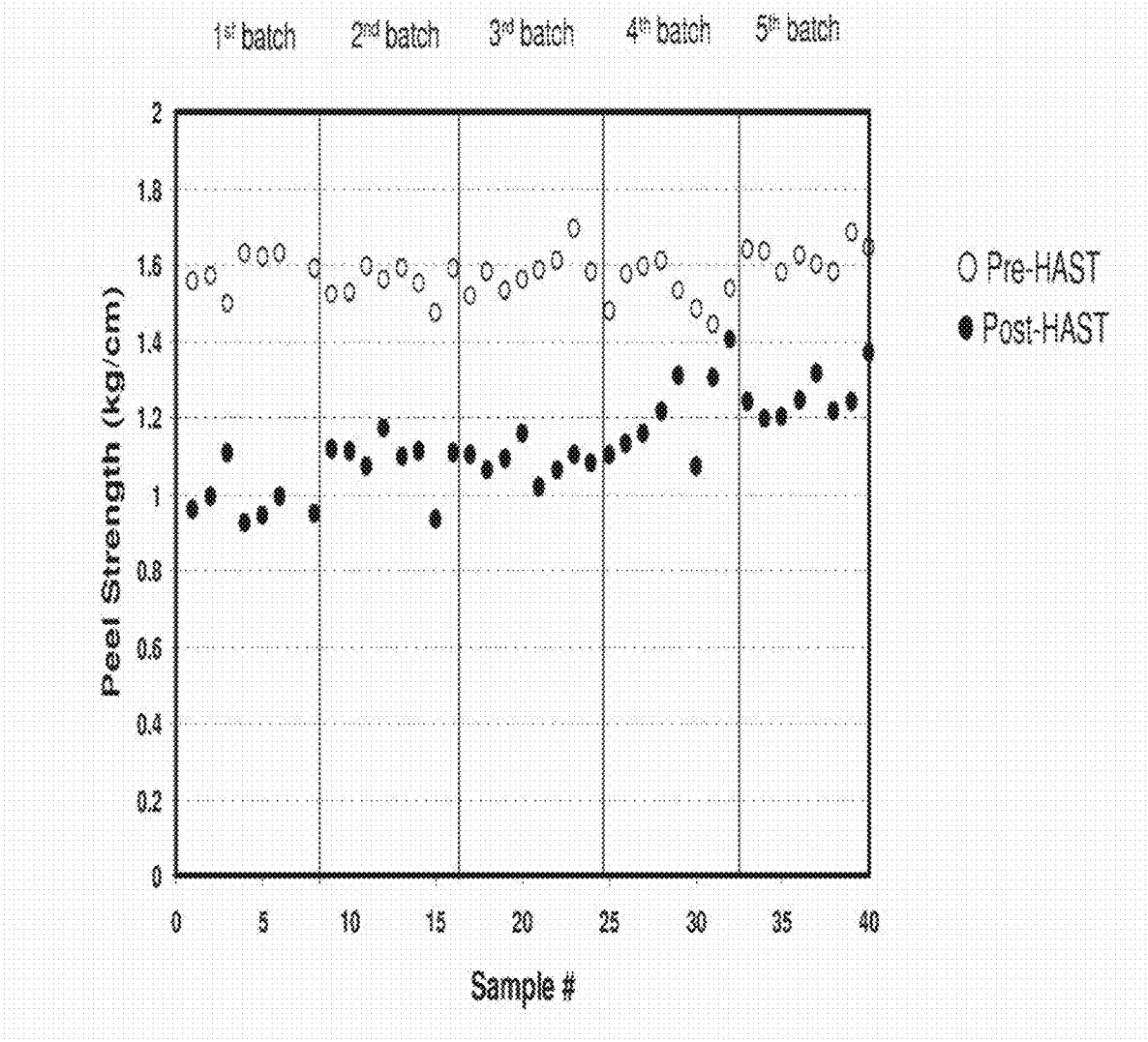

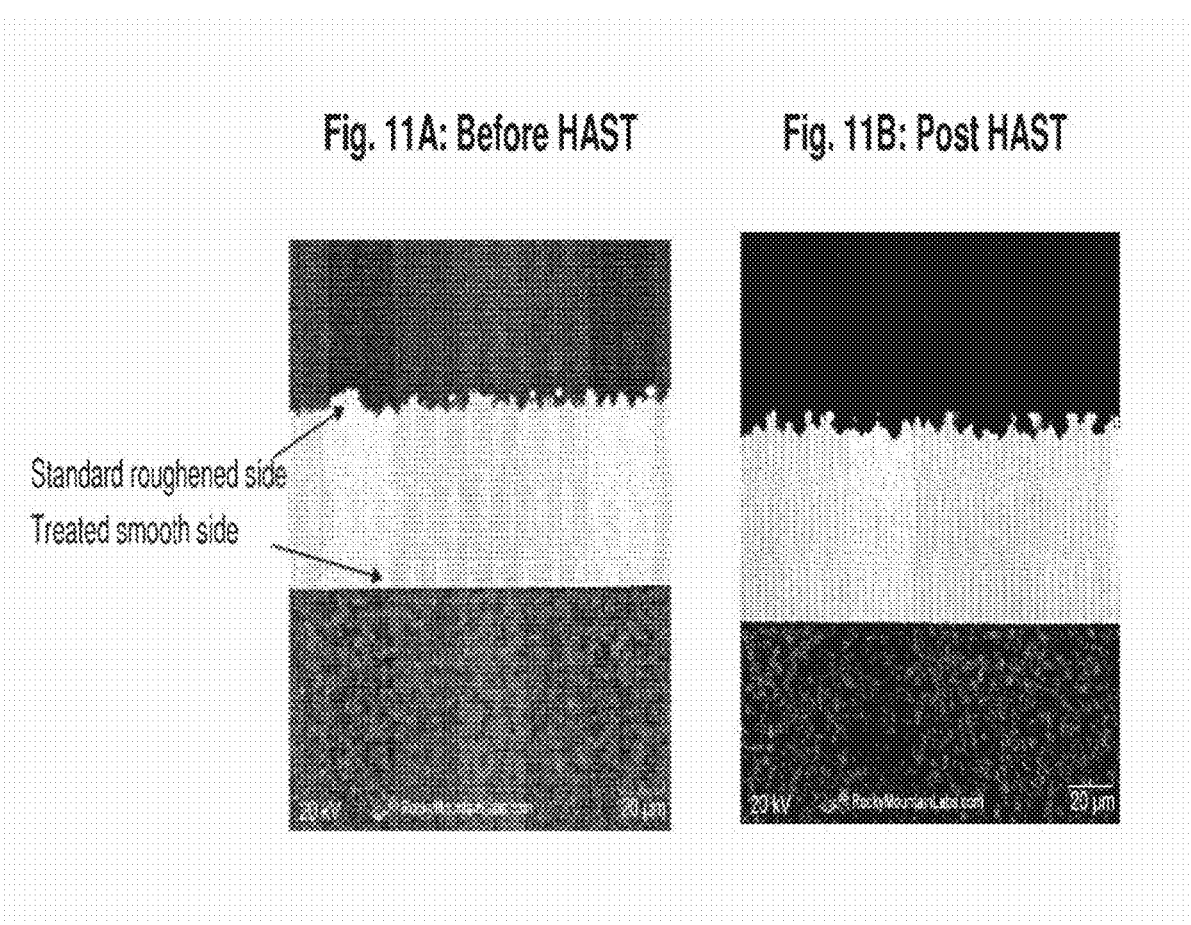

FIG. 12A
Surface appears to be clean Cu without resin transferred suggesting that the peeled surface breaks at the Cu-resin interface.
Full mode
Topographic mode

FIG. 12B
Most areas covered by resin suggesting Cu-resin interface breaks within the resin, not at the Cu-resin interface
Full mode
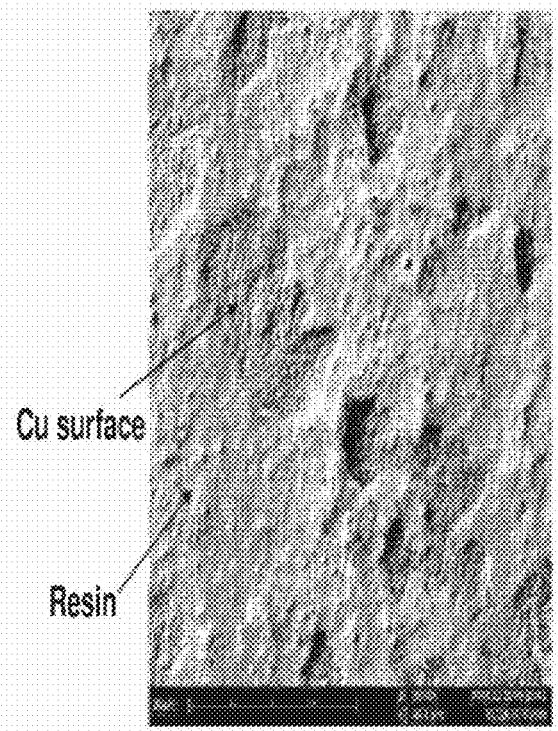
Topographic mode

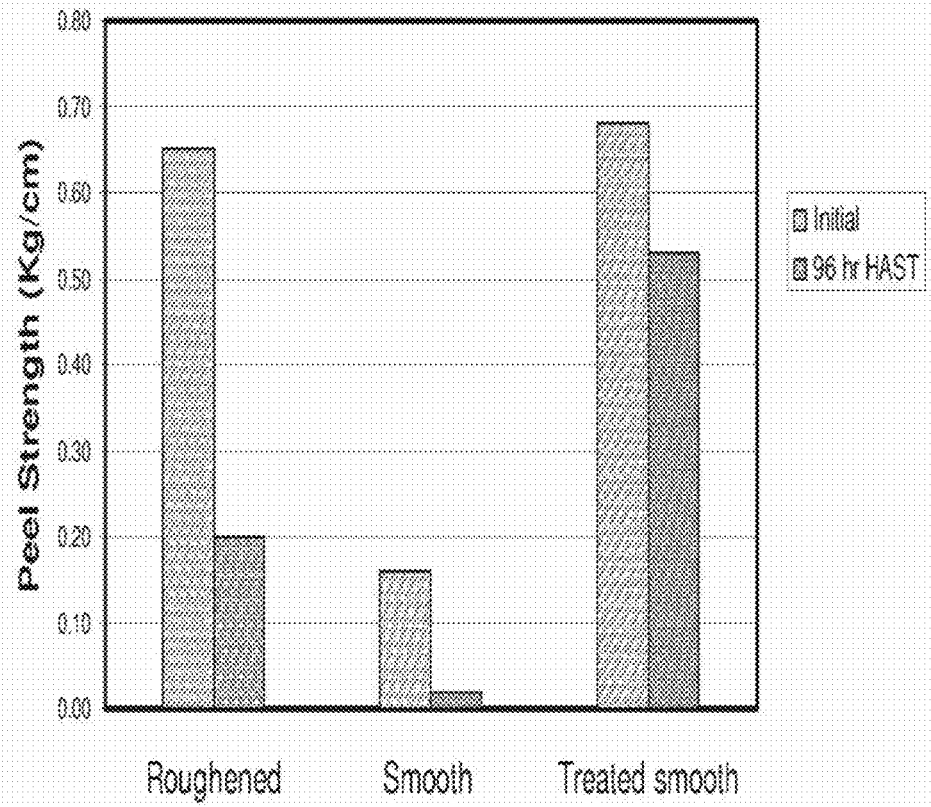

No undercut and delamination after subsequent processing

METHODS OF TREATING METAL SURFACES AND DEVICES FORMED THEREBY

CROSS-REFERENCE TO RELATED APPLICATIONS

This application is a continuation of and claims priority under 35 U.S.C. § 120 to U.S. application Ser. No. 14/009,517, filed 2 Oct. 2013 and accorded a 35 U.S.C. § 371(c) date of 19 May 2014, now U.S. Pat. No. 9,763,336. which is a U.S. National Stage Application based on and claiming priority under 35 U.S.C. § 371(c) to International Application No. PCT/US2010/41061, filed 6 Jul. 2010, which in turn claims benefit under 35 U.S.C. § 119(e) to U.S. Provisional Appl. No. 61/270,347, filed 6 Jul. 2009, the entirety of each of which are hereby incorporated herein by reference.

TECHNICAL FIELD

Embodiments of the present invention relate generally to methods of treating metal surfaces to enhance adhesion or binding to substrates and other materials, and devices formed thereby. In some embodiments, the present invention relates to the manufacture of printed circuit boards (PCB's) or printed wiring boards (PWB's), and particularly to methods for treating metal surfaces, such as but not limited to copper surfaces, to increase the adhesion between a copper surface and an organic material, and devices formed therefrom. In some embodiments of the present invention, methods of achieving improved bonding strength without roughening the topography of a metal surface are provided. The metal surface obtained by this method provides strong bonding to resin layers.

BACKGROUND OF THE INVENTION

Miniaturization, portability, and ever-increasing functionalities of consumer electronics continually drive printed circuit board manufacturing towards smaller and more densely packed boards. Increased circuit layer count, decreased core and laminate thicknesses, reduced copper line width and spacing, smaller diameter through-holes and micro-vias are some of the key attributes of high density interconnect (HDI) packages or multilayer PCB's.

Copper circuitry forming the circuit layout of the PCB is fabricated typically either by a subtractive process, or an additive process, or their combination. In the subtractive process, the desired circuit pattern is formed by etching downward from a thin copper foil laminated to a dielectric substrate where the copper foil is covered with a photoresist and a latent image of the desired circuit is formed in the resist after light exposure, the non-circuit area of the resist is washed away in a resist developer and the underlying copper is etched away by an etchant. In the additive process, the copper pattern is built upward from a bare dielectric substrate in the channels of a circuit pattern formed by photoresist. Further copper circuit layers are bonded together by partially-cured dielectric resin, often called "prepreg," to form a multilayer assembly of alternating copper circuitry conductive layers and dielectric resin insulation layers. The assembly is then subjected to heat and pressure to cure the partially-cured resin. Through-holes are drilled and plated with copper to electrically connect all circuit layers and thus form a multilayer PCB. Processes for the fabrication of multilayer PCB's are well known in the art and described in numerous publications, for example, "Printed Circuits Handbook," Sixth Edition, Edited by C. F. Coombs, Jr., McGraw-Hill Professional, 2007 and "Printed Circuit Board Materials Handbook," Edited by M. W. Jawitz, McGraw-Hill, 1997. Regardless of the PCB structures and fabricating methods, it is essential to achieve good adhesion between the copper circuit layer and resin insulation layer. Circuit boards of insufficient adhesion cannot survive the high temperature of solder reflow and subsequent soldering, resulting in delamination of the board and electrical malfunctions.

The surface of the copper circuit as patterned is smooth; however, this smooth surface does not adhere well to the resin layer. It is theoretically known that increasing the contact area between the two dissimilar materials would increase the adhesion strength. To improve the bonding between the copper and the resin, most conventional approaches rely on creating a highly roughened copper surface to increase its surface area and introduce microravines and ridges into the surface that act as mechanical bonding anchors to promote adhesion to the resin.

One of the most widely known and used approaches is the so-called "black oxide process" in which a black colored oxide layer having a rough surface is formed on top of the copper surface. The black oxide consists of needle-shaped dendritic crystals or whiskers of a mixture of cuprous oxide and cupric oxide of up to 5 microns in length. This large crystalline structure provides high surface area and mechanical anchoring effect and hence good bondability. U.S. Pat. Nos. 2,364,993, 2,460,896, and 2,460,898 to Meyer first describe the oxidation of a copper surface to a black oxide layer using an alkaline chlorite solution. Some exemplary disclosures of earlier efforts in applying this method to copper-resin bonding in PCB's include U.S. Pat. Nos. 2,955,974, 3,177,103, 3,198,672, 3,240,662, 3,374,129, and 3,481,777.

Although such needle-shaped oxide layer greatly increases the surface area and bondability, the dendritic crystals are fragile and easily damaged during the lamination process resulting in bonding failure within the oxide layer. Subsequent modifications to the oxide process have focused on optimizing the reagent concentrations and other process parameters in order to reduce the crystal size and therefore the thickness of the oxide layer to improve mechanical stability. Some notable improvements in this regard are represented by U.S. Pat. Nos. 4,409,037 and 4,844,981, where there are described formulations of an alkaline chlorite solution at specific concentration levels and hydroxide to chlorite ratios. U.S. Pat. No. 4,512,818 describes the addition of water soluble or dispersible polymer additives in an alkaline chlorite solution to cause a black oxide coating of reduced thickness and greater homogeneity. U.S. Pat. No. 4,702,793 describes a method of pre-treating the copper surface with sulfuroxy acid reducing agent to promote the rapid formation of a copper oxide. Other methods for forming black oxide layers include oxidation of the copper surface with hydrogen peroxide as described in U.S. Pat. No. 3,434,889, alkaline permanganate as described in U.S. Pat. No. 3,544,389, thermal oxidation as described in U.S. Pat. No. 3,677,828, and phosphoric acid-dichromate solution as described in U.S. Pat. No. 3,833,433.

One problem associated with this oxide roughening approach is that copper oxides are soluble in acid; and serious delamination of the bonding interface occurs during later process steps which involve the use of acid. For example, as noted earlier through-holes are drilled through the multilayer board and plated with copper to provide interconnection of the circuit layers. Resin smear is often formed on the surface of the holes from drilling and must be removed by a desmear process which involves permanganate etch followed by acid neutralization. The acid can dissolve the copper oxide up to several millimeters inward from the surface of the hole, which is evidenced by the formation of a pink-ring around the through-hole owing to the pink color of the underlying copper. The formation of pink-rings corresponds to localized delamination and represents serious defects in the PCB's. These defects have become a significant bottleneck in the production of multi-layer PCB's and extensive efforts have been extended in seeking further improvement in the oxide layer so that it is not susceptible to acid attack and such localized delamination.

Approaches to solving the pink-ring problem have largely involved post-treatment of the copper oxide. For example, U.S. Pat. No. 3,677,828 describes a method of first oxidizing the copper surface to form an oxide layer and then treating the oxide layer with phosphoric acid to form a glass like film of copper phosphate resulting in high bonding strength and acid resistance. U.S. Pat. No. 4,717,439 describes a process for improving the acid resistance of copper oxide by contacting the copper oxide with a solution containing an amphoteric element which forms an acidic oxide such as selenium dioxide. U.S. Pat. No. 4,775,444 describes a process of first forming a copper oxide layer and then treating with chromic acid to stabilize and/or protect the copper oxide from dissolution in an acid.

A number of studies have shown that acid resistance is improved by first forming cupric oxide on the surface of the copper and subsequently reducing the cupric oxide to cuprous oxide or copper-rich surface. U.S. Pat. No. 4,642,161 describes a method of reducing the cupric oxide using a borane reducing agent represented by the general formula $BH_3NHRR'$, wherein R and R' are each selected from the group consisting of H, $CH_3$ and $CH_2CH_3$. U.S. Pat. No. 5,006,200 describes reducing agents selected from the group consisting of diamine ($N_2H_4$), formaldehyde (HCHO), sodium thiosulfate ($Na_2S_2O_3$) and sodium borohydride ($NaBH_4$). U.S. Pat. Nos. 5,721,014, 5,750,087, 5,753,309, and WO 99/02452 describe reducing agents consisting of cyclic borane compounds, such as morpholine borane, pyridine borane, piperidine borane, etc. The most commonly practiced method of reducing cupric oxide to form cuprous oxide is by use of the reducing agent dimethylamine borane (DMAB). This approach has reduced the radius of the pink-ring to certain degree, but is still limited and has not solved the problem completely since cuprous oxide is not completely insoluble in an acid.

Attempts to address the problem mentioned above have been made, for example as shown in U.S. Pat. Nos. 5,492,595 and 5,736,065 which describe methods of reducing the copper oxide to metallic copper while maintaining the needle-like structure of the oxide. However, such needle-like structure is mechanically unstable and suffers from crush-down during the lamination process. Alternative oxide coating processes have been developed subsequently. Some exemplary processes are described in U.S. Pat. Nos. 5,532,094, 6,946,027 B2, 5,807,493, 6,746,621 B2, 5,869,130, 6,554,948, and 5,800,859. These alternative processes produce highly roughed copper surface by combining the traditional oxidation process with a controlled etch that roughens the underlying copper surface while oxidizing it at the same time. In many cases, an organic layer is coated simultaneously to act as corrosion inhibitor or adhesion promoter. In U.S. Pat. No. 5,800,859, there is described a micro-roughening process using an etching agent comprising hydrogen peroxide, an inorganic acid, and a corrosion inhibitor such as triazole. U.S. Pat. Nos. 6,716,281 B2, 6,946,027 B2, 7,108,795 B2, 7,211,204 B2, and 7,351,353 B1 describe similar approaches for providing roughened copper surfaces using a composition comprising an oxidizer, a pH adjuster, a topography modifier, a uniformity enhancer, and an azole inhibitor. For the same purpose, U.S. Pat. Nos. 5,532,094, 5,700,389, 5,807,493, 5,885,476, 5,965,036, 6,426,020 B1, and 6,746,621 B2 describe a micro-etching composition consisting of an oxidizer like hydrogen peroxide, a cupric ion source, an organic acid, a halide ion source, and an azole type inhibitor. These approaches have increased the acid resistance; however, the interface bonding is achieved mainly by mechanical anchors and the adhesion strength diminishes rapidly as the surface roughness of the treated copper surface decreases. Thus, improvements are still needed.

Moreover, producing repeatable oxide layers is difficult. A significant problem with the formation of oxides is that their growth is difficult to control. Traditional techniques for controlling growth of an oxide layer are to use time or temperature as the vehicle to promote or stop growth of the oxide. Such prior art methods suffer from poor reliability and repeatability.

As is readily seen, while numerous approaches have been developed for improving the adhesion between the copper surface and dielectric resin, the approaches have relied on creating a highly roughened surface to promote adhesion. It is universally thought in the prior art that the copper surface must be roughened to increase the surface area for bonding or adhering to the epoxy or dielectric resins. This approach however suffers from severe limitations since the width and/or spacing of the copper lines is limited thus preventing further miniaturization of the circuitry. Moreover, oxide layers formed by prior art methods suffer from poor repeatability and reliability. The current trend toward higher density and finer line circuitry with increased layer counts has generated the need for higher bonding strength of copper to dielectric resins while retaining the smooth surface. Clearly, there is a present need for further advances and developments in the art.

Moreover, protective coatings are used in almost every industry where metal surfaces are exposed to atmosphere, corrosive environments or complex interfaces. In prior art techniques, the coating is typically applied after extensive cleaning and pre-treatment of the metal surface, which is performed to create a surface that will bond to the coating. These pretreatment steps can be as simple as acid or base-washing, solvent washing, and oxidation and/or reductive treatments to increase the surface area and/or roughness of the surface. Additionally, many conventional treatments involve the deposition of other metals, e.g., chromium or titanium, that serve as better anchors for subsequent deposition of additional organic layers. Finally, there has been a tremendous effort to utilize organic (molecular) reagents to derivatize the surface of these metals to provide additional adhesion to the coatings. All of these prior art processes are time consuming and expensive, and a significant advantage would be provided by a process that minimize the number of steps and the chemical concentration and complexity in the preparation of the metals for coating.

SUMMARY

Accordingly, some embodiments of the present invention provide methods for treating a smooth metal surface to increase the adhesion between the metal surface and an organic layer. A metal surface treatment process that increases the bonding strength and yet does not significantly roughen the metal surface as provided by embodiments of the present invention is a complete departure from, and is contrary to, the conventional prior art techniques.

In some embodiments of the present invention methods provide for achieving improved bonding strength between materials without roughening the metal surface.

In some embodiments, a method of treating a metal surface to promote adhesion or binding between the metal surface and an organic layer is provided, characterized in that the metal surface is stabilized by forming a metal oxide layer thereon, and then the metal oxide layer is conditioned with a molecular reagent and/or reducing agent to achieve selective oxide thickness and morphology.

In some embodiments, a method of treating a metal surface to promote adhesion or binding between the metal surface and an organic material is provided characterized in that: a metal oxide layer or a stabilization layer is formed on the metal surface, and formation of the metal oxide layer is controlled by a self-limiting reaction between the metal oxide and a molecular reagent or a surface modifier compound, also sometimes called an inhibitor compound.

In some embodiments, the stabilization layer has a surface roughness of up to about 140 nm Ra and exhibits morphology comprising grains of an average size in the range of 200 nanometers or less, and has a thickness in the range of about 100 to 200 nanometers. In some embodiments the stabilization layer is comprised substantially of copper oxide. In some embodiments a molecular layer is formed atop the stabilization layer.

In another aspect, embodiments of the present invention provide a printed circuit board, comprising: at least one metal layer; at least one epoxy layer; and a stabilization layer formed between the metal layer and epoxy layer.

In further embodiments of the present invention methods of bonding a smooth metal surface and a resin are provided in which the bonding interface has desired resistance to heat, moisture, and chemicals involved in post-lamination process steps, and therefore is particularly suitable for multilayer PCB lamination, among other applications.

In some embodiments of the present invention methods are provided that enable fabrication of high density multilayer PCB's with line and/or space widths of equal to and less than 10 microns.

In another aspect, the present invention can be utilized in a significant number of applications. In one such example, embodiments of the present invention can by used to form protective coatings.

In another aspect, embodiments of the present invention provide methods of fabricating a printed circuit board, comprising the steps of: pre-cleaning a copper surface with an alkaline and/or peroxide solution; stabilizing the copper surface by forming a copper oxide layer thereon; terminating formation of the copper oxide layer by a self limiting reaction between the copper oxide and one or more surface modifier or inhibitor compounds; and bonding the treated copper surface with a resin. In some embodiments, one or more molecules may be coupled to the copper oxide layer, the one or more organic molecules comprising a thermally stable base bearing one or more binding groups configured to bind the copper oxide surface and/or one or more attachment groups configured to attach to the resin.

In yet another aspect, embodiments of the present invention provide a method of controlling the growth of an oxide layer on the surface of a metal comprising: terminating growth of the oxide layer by a self limiting reaction between the oxide layer and one or more surface modifier compounds.

Additionally, other embodiments of the present invention provide a reduction composition, comprising: one or more reductants; and one or more molecular reagent compounds.

Additionally, other embodiments of the present invention provide an oxidant composition, comprising: one or more oxidants; and one or more surface modifier or inhibitor compounds.

BRIEF DESCRIPTION OF THE FIGURES

The foregoing and other aspects of embodiments of the present invention will be apparent upon consideration of the following detailed description, taken in conjunction with the accompanying drawings, in which like reference characters refer to like parts throughout, and in which:

FIGS. 1A and 1B schematically illustrate one embodiment of the metal-resin bonding process according to embodiments of the present invention as compared to the conventional roughening process;

FIG. 2 illustrates experimental process flow diagrams illustrating one embodiment of the method of the present invention;

FIGS. 3A and 3B show a simplified exemplary reaction scheme for two embodiments of the present invention;

FIGS. 4A to 4D show SEM photographs of: (A) a smooth copper surface prior to any treatment (i.e. the control); (B) a copper surface treated according to one embodiment of the present invention which shows the smoothness of the stabilization layer of the treated surface; and compared to (C) a conventional rough black oxide surface as described in the prior art; and (D) a micro-etch roughened copper surface as described in the prior art;

FIG. 5 is a table which compares the surface roughness expressed in both Ra and Rz of the copper surfaces shown in FIGS. 4A to 4D;

FIGS. 8A and 8D are simplified cross sectional views showing the preparation of test samples and illustrating the lamination process used according to some embodiments;

FIG. 10 graphically illustrates the reproducibility of peel strength and HAST stability for five batches of samples of epoxy laminated smooth copper surfaces treated according to embodiments the present invention;

FIGS. 11A and 11B show SEM cross-sectional views of a laminated treated smooth copper surfaces according to embodiments of the present invention (bottom surface) before and after HAST, and compared to a standard rough surface (top surface); and demonstrating that the methods of the present invention do not significantly roughen the surface and that there is no delamination at that interface after HAST;

FIG. 12A shows two SEM photographs (full and topographical mode) of a peeled copper surface after HAST demonstrating that the copper-resin interface breaks right at an untreated, smooth copper surface control. FIG. 12B shows two SEM photographs (full and topographical mode) of a peeled, treated smooth copper surface according to embodiments of the present invention after HAST and showing that most areas are covered by resin suggesting that failure occurs within the resin, not at the copper-resin interface;

FIGS. 14A and 14B graphically illustrate peel strength and surface roughness for solder resist laminated smooth copper surface treated according to embodiments of the present invention, as compared to control substrates and conventional roughened copper surfaces;

DETAILED DESCRIPTION

Figure 6:
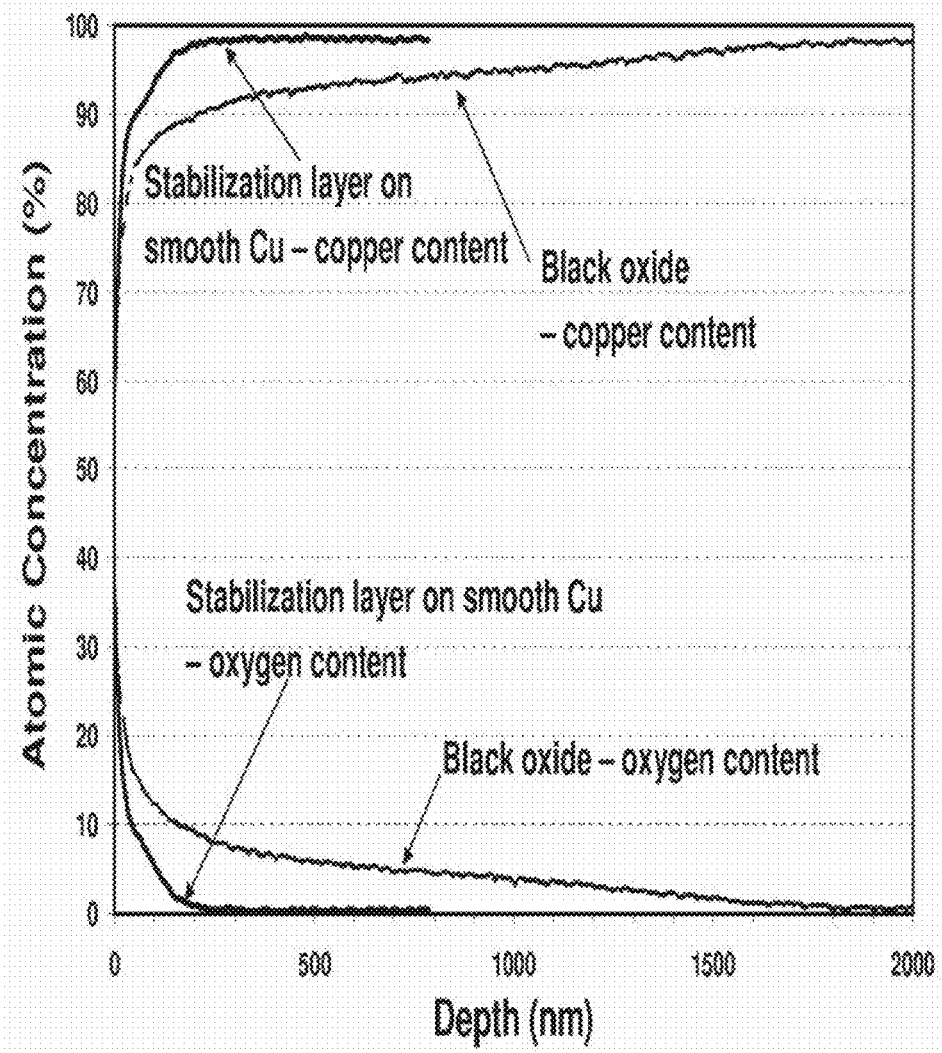
FIG. 6 graphically shows the Auger depth profile demonstrating that the stabilization layer has a thickness of about 150 nm as prepared according to embodiments of the present invention, compared to a conventional copper black oxide layer that is typically greater than 1 micron in depth.

It is to be understood that both the foregoing general description and the following description are exemplary and explanatory only and are not restrictive of the methods and devices described herein. In this application, the use of the singular includes the plural unless specifically state otherwise. Also, the use of "or" means "and/or" unless state otherwise. Similarly, "comprise," "comprises," "comprising," "include," "includes," "including," "has," "have," and "having" are not intended to be limiting.

Embodiments of the present invention provide significant advances over the prior art in the manufacture of coatings and electronics and in particular printed circuit boards by, among other aspects, forming a stabilization layer on the surface of metal substrates that adhere strongly to organic materials (such as, without limitation, epoxy or resin substrates). The stabilization layers have relatively smooth morphology, and as such their strong adhesion to organic materials is surprising and unexpected. In fact, the central teaching and approach of the prior art methods is that the metal oxide surface must be roughened in order for sufficient adhesion to occur.

Unique methods have been developed to form a stabilization layer having desired thickness and morphology as well as an ability to adhere to subsequent layers of organic materials deposited thereon. That is, in some embodiments a modified metal oxide is formed through selective control or alteration of the oxidation step, the reduction step, or both with a molecular reagent that modifies the growth and stability of that oxide layer. Typically, oxide growth is very difficult to control. Prior art techniques typically require post oxidation steps in order to reduce the thickness of the oxide, to further condition the oxide morphology, and the like. Embodiments of the present invention provide a significant innovation by employing a surface modifier or inhibitor compound that reacts with the oxide to control or limit the extent of oxide growth. This can be accomplished by adding the surface modifier to the oxidation solution as it is forming to slow down the oxide growth and then block further oxidation. Alternatively, a standard oxidation reaction can be utilized, followed with a reduction step that has been modified by addition of the surface modifier to provide stabilization. Embodiments of the present invention utilize this reaction to control the growth rate, thickness, and morphology of the oxide, and all of these aspects can be accomplished in a single step. The resulting metal oxide film, as formed, exhibits desirable thickness and morphological properties without the need for post processing steps. Elimination of post processing steps significantly reduces the complexity of the process and provides significant cost savings.

Moreover, embodiments of the present invention provide methods of controlling the growth of an oxide layer on the surface of a metal. Specifically, in some embodiments growth of an oxide layer is terminated by a self limiting reaction between the oxide layer and one or more surface modifier or inhibitor compounds. In some embodiments, examples of surface modifiers or inhibitor compounds include surface active molecules (SAMs) as described in detail below. Of significant advantage embodiments of the present invention provide a stable, controllable process window. Such a stable process window provides a robust, repeatable process. This is a significant advance, particularly because with the prior art methods there is continuous oxide growth of the metal oxide layer which is one of the primary failure mechanisms of conventional PCB boards.

The metal surface is stabilized by exposing the metal surface to an oxidant. In an exemplary embodiment the oxidant is selected from any one or more of: sodium chlorite, hydrogen peroxide, permanganate, perchlorate, persulphate, ozone or mixtures thereof. The step of stabilizing the metal surface may be carried out at a temperature in the range of room temperature to about 80° C.

After oxidation, the metal oxide layer may be conditioned with a reducing agent. In some embodiments the reducing agent is selected from any one or more of formaldehyde, sodium thiosulfate, sodium borohydride, a borane reducing agent represented by the general formula $BH_3NHRR'$, wherein R and R' are each selected from the group consisting of H, $CH_3$ and $CH_2CH_3$, such as dimethylamine borane (DMAB), a cyclic borane, such as morpholine borane, pyridium borane, piperidine borane. Conditioning of the metal oxide layer may be carried out at a temperature in the range of room temperature to about 50° C. In some embodiments the entire method is carried out for a time in the range of about 2 to 20 minutes.

Additionally, some embodiments of the present invention provide for, after conditioning, contacting the oxidized surface with one or more organic molecules comprising a thermally stable base bearing one or more binding groups configured to bind the metal surface and one or more attachment groups configured to attach to the organic material. In an exemplary embodiment the one or more organic molecules is the surface modifier or inhibitor compound.

In some embodiments, a method of treating a metal surface to promote adhesion or binding between the metal surface and an organic material is provided characterized in that: a stabilization layer is formed on the metal surface, and formation of the stabilization layer is controlled by a self-limiting reaction between the metal oxide and a surface modifier or inhibitor compound. Of significant advance, according to embodiments of the present invention both formation of the oxide layer and control of its growth (including termination) are achieved in one step.

Of particular advantage, the metal oxide layer, also sometimes referred to as a stabilization layer, exhibits unique and desirable features. In some embodiments the formed stabilization layer has a thickness of about 200 nanometers and less. In some embodiments the stabilization layer has morphology comprised of a substantially amorphous structure.

In an exemplary embodiment the formed stabilization layer has grains of a size in the range of 200 nanometers and less. In other embodiments the formed stabilization layer has grains of a size in the range of 150 nanometers and less. In some embodiments the formed stabilization layer has grains that are substantially randomly oriented. Typically, but not exclusively, the stabilization layer is comprised of copper oxide and molecular reagents.

To begin formation of the stabilization layer, oxidation initiation is carried out by exposing the metal surface to an oxidant. In some embodiments the oxidant solution is comprised of: one or more oxidants, and one or more surface modifiers can be added. In an exemplary embodiment one or more oxidants are comprised of: sodium chlorite, hydrogen peroxide, permanganate, perchlorate, persulphate, ozone, or mixtures thereof.

Any suitable concentration of oxidant solution may be used. In some embodiments the oxidant solution is comprised substantially of one or more oxidants in solution. In general, the surface modifier is selected from compounds that react with the stabilization layer in a self-limiting reaction. In some embodiments, the surface active molecule (SAM) is selected such that it reacts with the metal oxide surface to control the reaction rate as the metal oxide is forming, and then eventually slows and terminates the oxidation reaction. Optionally, functional groups can be added to the surface modifier compound to provide additional bonding with organic materials, such as but not limited to epoxies and the like.

Once oxidation is initiated, oxide starts to grow on top of the metal surface. As this stabilization layer is formed, the surface modifier compound starts to react with oxygen containing moieties on the surface of the metal. This will slow down and block further oxidation and thus achieve self-limiting reaction of the oxide formation.

Additionally, some embodiments of the present invention provide for contacting the metal surface with one or more organic or inorganic molecules which are surface active molecules (SAMs) comprising a thermally stable base bearing one or more binding groups configured to bind the metal surface and one or more attachment groups configured to attach to the organic material. In an exemplary embodiment the one or more surface modifier molecules is a surface active moiety.

In some embodiments a method of treating a metal surface to promote adhesion or binding between the metal surface and an organic material is provided characterized in that: the metal surface is stabilized by forming a stabilization layer thereon, and then the stabilization layer is conditioned with a reducing agent to achieve selective oxide thickness and morphology.

Of particular advantage, the metal oxide layer, also sometimes referred to as a stabilization layer, exhibits unique features. In some embodiments the stabilization layer after conditioning has a thickness of about 200 nanometers and less. In some embodiments the metal oxide has morphology comprised of a substantially amorphous structure.

In an exemplary embodiment the stabilization layer has a highly distributed grain structure, and after conditioning the grains have a size in the range of 200 nanometers and less. In other embodiments the stabilization layer has grains, and after conditioning the grains have a size in the range of 100 nanometers and less. In some embodiments the metal oxide has grains, and after conditioning the grains are substantially randomly oriented. Typically, but not exclusively, the stabilization layer is comprised of copper oxide.

The metal surface is stabilized by exposing the metal surface to an oxidant. In an exemplary embodiment the oxidant is selected from any one or more of: sodium chlorite, hydrogen peroxide, permanganate, perchlorate, persulphate, ozone, or mixtures thereof. The step of stabilizing the metal surface may be carried out at a temperature in the range of room temperature to about 80° C. Alternatively, the metal surface can be stabilized by thermal oxidation and electrochemical anodic oxidation.

After stabilization, the stabilization layer can be conditioned with a reducing agent. In some embodiments the reducing agent is selected from any one or more of: formaldehyde, sodium thiosulfate, sodium borohydride, a borane reducing agent represented by the general formula $BH_3NHRR'$, wherein R and R' are each selected from the group consisting of H, $CH_3$ and $CH_2CH_3$, such as dimethylamine borane (DMAB), a cyclic borane, such as morpholine borane, pyridium borane, piperidine borane.

Conditioning of the stabilization layer may be carried out at a temperature in the range of room temperature to about 50° C. In some embodiments the entire method is carried out for a time in the range of about 2 to 20 minutes.

Additionally, some embodiments of the present invention provide for, after conditioning, contacting the metal surface with one or more surface active molecules comprising a thermally stable base bearing one or more binding groups configured to bind the metal surface and one or more attachment groups configured to attach to an organic material such as PCB epoxies and the like. In an exemplary embodiment the one or more organic molecules is a surface active moiety.

Any suitable surface active moiety may be employed. In some embodiments the surface modifier moiety is selected from the group consisting of a macrocyclic proligand, a macrocyclic complex, a sandwich coordination complex and polymers thereof. Alternatively, the surface modifier moiety may be comprised of a porphyrin.

The one or more surface active molecules may be selected from the group of: a porphyrin, a porphyrinic macrocycle, an expanded porphyrin, a contracted porphyrin, a linear porphyrin polymer, a porphyrinic sandwich coordination complex, a porphyrin array, a silane, a tetraorgano-silane, aminoethyl-aminopropyl-trimethoxysilane, (3-Aminopropyl)trimethoxysilane, (1-[3-(Trimethoxysilyl)propyl]urea), (3-Aminopropyl) triethoxysilane, ((3-Glycidyloxypropyl) trimethoxysilane), (3-Chloropropyl) trimethoxysilane, (3-Glycidyloxypropyl)trimethoxysilane, Dimethyldichlorosilane, 3-(Trimethoxysilyl)propyl methacrylate, Ethyltriacetoxysilane, Triethoxy(isobutyl)silane, Triethoxy(octyl)silane, Tris(2-methoxyethoxy)(vinyl)silane, Chlorotrimethyl silane, Methyltrichlorosilane, Silicon tetrachloride, Tetraethoxysilane, Phenyltrimethoxysilane, Chlorotriethoxysilane, ethylene-trimethoxysilane, an amine, a sugar or any combination of the above. Alternatively, inorganic molecules from the group consisting of molybdates, tungstates, tantalates, niobates, vanadates, isopoly or heteropoly acids of molybdenum, tungsten, tantalum, niobium, vanadium, and combinations of any of the foregoing can be used for the same purpose.

In some embodiments the one or more attachment group is comprised of an aryl functional group and/or an alkyl attachment group. When the attachment group is an aryl, the aryl functional group may be comprised of a functional group selected from any one or more of: acetate, alkylamino, allyl, amine, amino, bromo, bromomethyl, carbonyl, carboxylate, carboxylic acid, dihydroxyphosphoryl, epoxide, ester, ether, ethynyl, formyl, hydroxy, hydroxymethyl, iodo, mercapto, mercaptomethyl, Se-acetylseleno, Se-acetylselenomethyl, S-acetylthio, S-acetylthiomethyl, selenyl, 4,4,5,5-tetramethyl-1,3,2-dioxaborolan-2-yl, 2-(tri methyl silyl)ethynyl, vinyl, and combinations thereof.

When the attachment group is comprised of an alkyl, the alkyl attachment group comprises a functional group selected from any one or more of: acetate, alkylamino, allyl, amine, amino, bromo, bromomethyl, carbonyl, carboxylate, carboxylic acid, dihydroxyphosphoryl, epoxide, ester, ether, ethynyl, formyl, hydroxy, hydroxymethyl, iodo, mercapto, mercaptomethyl, Se-acetylseleno, Se-acetylselenomethyl, S-acetylthio, S-acetylthiomethyl, selenyl, 4,4,5,5-tetramethyl-1,3,2-dioxaborolan-2-yl, 2-(trimethylsilyl)ethynyl, vinyl, and combinations thereof.

In an alternative embodiment the at least one attachment group is comprised of an alcohol or a phosphonate. In further embodiments, the at least one attachment group may be comprised of any one of more of: amines, alcohols, ethers, other nucleophile, phenyl ethynes, phenyl allylic groups, phosphonates and combinations thereof.

In general, in some embodiments the organic molecule is comprised of a thermally stable unit or base with one more binding groups X and one or more attachment groups Y. In certain embodiments, the organic molecule is heat-resistant metal-binding molecule, and may be comprised of one or more "surface active moieties," also referred to in associated applications as "redox active moieties" or "ReAMs". One embodiment of the invention encompasses the use of compositions of molecular components using surface active moieties generally described in U.S. Pat. Nos. 6,208,553, 6,381,169, 6,657,884, 6,324,091, 6,272,038, 6,212,093, 6,451,942, 6,777,516, 6,674,121, 6,642,376, 6,728,129, US Publication Nos: 20070108438, 20060092687, 20050243597, 20060209587, 20060195296, 20060092687, 20060081950, 20050270820, 20050243597, 20050207208, 20050185447, 20050162895, 20050062097, 20050041494, 20030169618, 20030111670, 20030081463, 20020180446, 20020154535, 20020076714, 2002/0180446, 2003/0082444, 2003/0081463, 2004/0115524, 2004/0150465, 2004/0120180, 2002/010589, U.S. Ser. Nos. 10/766,304, 10/834,630, 10/628,868, 10/456,321, 10/723,315, 10/800,147, 10/795,904, 10/754,257, 60/687,464, all of which are expressly incorporated in their entirety. Note that while in the associated applications listed immediately above, the heat-resistant molecule is sometime referred to as "redox active moieties" or "ReAMs," in the instant application term surface active moiety is more appropriate. In general, in some embodiments there are several types of surface active moieties useful in the present invention, all based on polydentate proligands, including macrocyclic and non-macrocyclic moieties. A number of suitable proligands and complexes, as well as suitable substituents, are outlined in the references cited above. In addition, many polydentate proligands can include substitution groups (often referred to as "R" groups herein and within the cited references, and include moieties and definitions outlined in U.S. Pub. No. 2007/0108438, incorporated by reference herein specifically for the definition of the substituent groups.

Suitable proligands fall into two categories: ligands which use nitrogen, oxygen, sulfur, carbon or phosphorus atoms (depending on the metal ion) as the coordination atoms (generally referred to in the literature as sigma (σ) donors) and organometallic ligands such as metallocene ligands (generally referred to in the literature as pi donors, and depicted in U.S. Pub. No. 2007/0108438 as Lm).

In addition, a single surface active moiety may have two or more redox active subunits, for example, as shown in FIG. 13A of U.S. Pub. No. 2007/0108438, which utilizes porphyrins and ferrocenes.

In some embodiments, the surface active moiety is a macrocyclic ligand, which includes both macrocyclic proligands and macrocyclic complexes. By "macrocyclic proligand" herein is meant a cyclic compound which contains donor atoms (sometimes referred to herein as "coordination atoms") oriented so that they can bind to a metal ion and which are large enough to encircle the metal atom. In general, the donor atoms are heteroatoms including, but not limited to, nitrogen, oxygen and sulfur, with the former being especially preferred. However, as will be appreciated by those in the art, different metal ions bind preferentially to different heteroatoms, and thus the heteroatoms used can depend on the desired metal ion. In addition, in some embodiments, a single macrocycle can contain heteroatoms of different types.

A "macrocyclic complex" is a macrocyclic proligand with at least one metal ion; in some embodiments the macrocyclic complex comprises a single metal ion, although as described below, polynucleate complexes, including polynucleate macrocyclic complexes, are also contemplated.

A wide variety of macrocyclic ligands find use in the present invention, including those that are electronically conjugated and those that may not be. A broad schematic of a suitable macrocyclic ligand is shown and described in FIG. 15 of U.S. Pub. No. 2007/0108438. In some embodiments, the rings, bonds and substituents are chosen to result in the compound being electronically conjugated, and at a minimum to have at least two oxidation states.

In some embodiments, the macrocyclic ligands of the invention are selected from the group consisting of porphyrins (particularly porphyrin derivatives as defined below), and cyclen derivatives. A particularly preferred subset of macrocycles suitable in the invention include porphyrins, including porphyrin derivatives. Such derivatives include porphyrins with extra rings ortho-fused, or ortho-perifused, to the porphyrin nucleus, porphyrins having a replacement of one or more carbon atoms of the porphyrin ring by an atom of another element (skeletal replacement), derivatives having a replacement of a nitrogen atom of the porphyrin ring by an atom of another element (skeletal replacement of nitrogen), derivatives having substituents other than hydrogen located at the peripheral meso-, β- or core atoms of the porphyrin, derivatives with saturation of one or more bonds of the porphyrin (hydroporphyrins, e.g., chlorins, bacteriochlorins, isobacteriochlorins, decahydroporphyrins, corphins, pyrrocorphins, etc.), derivatives having one or more atoms, including pyrrolic and pyrromethenyl units, inserted in the porphyrin ring (expanded porphyrins), derivatives having one or more groups removed from the porphyrin ring (contracted porphyrins, e.g., corrin, corrole) and combinations of the foregoing derivatives (e.g. phthalocyanines, sub-phthalocyanines, and porphyrin isomers). Additional suitable porphyrin derivatives include, but are not limited to the chlorophyll group, including etiophyllin, pyrroporphyrin, rhodoporphyrin, phylloporphyrin, phylloerythrin, chlorophyll a and b, as well as the hemoglobin group, including deuteroporphyrin, deuterohemin, hemin, hematin, protoporphyrin, mesohemin, hematoporphyrin mesoporphyrin, coproporphyrin, uruporphyrin and turacin, and the series of tetraarylazadipyrromethines.

As will be appreciated by those in the art, each unsaturated position, whether carbon or heteroatom, can include one or more substitution groups as defined herein, depending on the desired valence of the system.

In addition, included within the definition of "porphyrin" are porphyrin complexes, which comprise the porphyrin proligand and at least one metal ion. Suitable metals for the porphyrin compounds will depend on the heteroatoms used as coordination atoms, but in general are selected from transition metal ions. The term "transition metals" as used herein typically refers to the 38 elements in groups 3 through 12 of the periodic table. Typically transition metals are characterized by the fact that their valence electrons, or the electrons they use to combine with other elements, are present in more than one shell and consequently often exhibit several common oxidation states. In certain embodiments, the transition metals of this invention include, but are not limited to one or more of scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, palladium, gold, mercury, rutherfordium, and/or oxides, and/or nitrides, and/or alloys, and/or mixtures thereof.

There are also a number of macrocycles based on cyclen derivatives. FIGS. 17 and 13C of U.S. Pub. No. 2007/0108438, depicts a number of macrocyclic proligands loosely based on cyclen/cyclam derivatives, which can include skeletal expansion by the inclusion of independently selected carbons or heteroatoms. In some embodiments, at least one R group is a surface active subunit, preferably electronically conjugated to the metal. In some embodiments, including when at least one R group is a surface active subunit, two or more neighboring R2 groups form cyclo or an aryl group. In the present invention, the at least one R group is a surface active subunit or moiety.

Furthermore, in some embodiments, macrocyclic complexes relying organometallic ligands are used. In addition to purely organic compounds for use as surface active moieties, and various transition metal coordination complexes with 8-bonded organic ligand with donor atoms as heterocyclic or exocyclic substituents, there is available a wide variety of transition metal organometallic compounds with pi-bonded organic ligands (see Advanced Inorganic Chemistry, 5th Ed., Cotton & Wilkinson, John Wiley & Sons, 1988, chapter 26; Organometallics, A Concise Introduction, Elschenbroich et al., 2nd Ed., 1992, 30 VCH; and Comprehensive Organometallic Chemistry II, A Review of the Literature 1982⁻1994, Abel et al. Ed., Vol. 7, chapters 7, 8, 1.0 & 11, Pergamon Press, hereby expressly incorporated by reference). Such organometallic ligands include cyclic aromatic compounds such as the cyclopentadienide ion [$C_5H_5(-1)$] and various ring substituted and ring fused derivatives, such as the indenylide (−1) ion, that yield a class of bis(cyclopentadienyl) metal compounds, (i.e. the metallocenes); see for example Robins et al., J. Am. Chem. Soc. 104:1882-1893 (1982); and Gassman et al., J. Am. Chem. Soc. 108:4228-4229 (1986), incorporated by reference. Of these, ferrocene [$(C_5H_5)_2Fe$] and its derivatives are prototypical examples which have been used in a wide variety of chemical (Connelly et al., Chem. Rev. 96:877-910 (1996), incorporated by reference) and electrochemical (Geiger et al., Advances in Organometallic Chemistry 23:1-93; and Geiger et al., Advances in Organometallic Chemistry 24:87, incorporated by reference) reactions. Other potentially suitable organometallic ligands include cyclic arenes such as benzene, to yield bis(arene) metal compounds and their ring substituted and ring fused derivatives, of which bis(benzene) chromium is a prototypical example, Other acyclic n-bonded ligands such as the allyl(−1) ion, or butadiene yield potentially suitable organometallic compounds, and all such ligands, in conjunction with other 7c-bonded and 8-bonded ligands constitute the general class of organometallic compounds in which there is a metal to carbon bond. Electrochemical studies of various dimers and oligomers of such compounds with bridging organic ligands, and additional non-bridging ligands, as well as with and without metal-metal bonds are all useful.

In some embodiments, the surface active moieties are sandwich coordination complexes. The terms "sandwich coordination compound" or "sandwich coordination complex" refer to a compound of the formula L-Mn-L, where each L is a heterocyclic ligand (as described below), each M is a metal, n is 2 or more, most preferably 2 or 3, and each metal is positioned between a pair of ligands and bonded to one or more hetero atom (and typically a plurality of hetero atoms, e.g., 2, 3, 4, 5) in each ligand (depending upon the oxidation state of the metal). Thus sandwich coordination compounds are not organometallic compounds such as ferrocene, in which the metal is bonded to carbon atoms. The ligands in the sandwich coordination compound are generally arranged in a stacked orientation (i.e., are generally cofacially oriented and axially aligned with one another, although they may or may not be rotated about that axis with respect to one another) (see, e.g., Ng and Jiang (1997) Chemical Society Reviews 26: 433-442) incorporated by reference. Sandwich coordination complexes include, but are not limited to "double-decker sandwich coordination compound" and "triple-decker sandwich coordination compounds". The synthesis and use of sandwich coordination compounds is described in detail in U.S. Pat. Nos. 6,212,093; 6,451,942; 6,777,516; and polymerization of these molecules is described in WO 2005/086826, all of which are included herein, particularly the individual substituent groups that find use in both sandwich complexes and the "single macrocycle" complexes.

In addition, polymers of these sandwich compounds are also of use; this includes "dyads" and "triads" as described in U.S. Pat. Nos. 6,212,093; 6,451,942; 6,777,516; and polymerization of these molecules as described in WO 2005/086826, all of which are incorporated by reference and included herein.

Surface active moieties comprising non-macrocyclic chelators are bound to metal ions to form non-macrocyclic chelate compounds, since the presence of the metal allows for multiple proligands to bind together to give multiple oxidation states.

In some embodiments, nitrogen donating proligands are used. Suitable nitrogen donating proligands are well known in the art and include, but are not limited to, NH2; NFIR; NRR'; pyridine; pyrazine; isonicotinamide; imidazole; bipyridine and substituted derivatives of bipyridine; terpyridine and substituted derivatives; phenanthrolines, particularly 1,10-phenanthroline (abbreviated phen) and substituted derivatives of phenanthrolines such as 4,7-dimethylphenanthroline and dipyridol[3,2-a:2',3'-c]phenazine (abbreviated dppz); dipyridophenazine; 1,4,5,8,9,12-hexaazatriphenylene (abbreviated hat); 9,10-phenanthrenequinone diimine (abbreviated phi); 1,4,5,8-tetraazaphenanthrene (abbreviated tap); 1,4,8,11-tetra-azacyclotetradecane (abbreviated cyclam) and isocyanide. Substituted derivatives, including fused derivatives, may also be used. It should be noted that macrocylic ligands that do not coordinatively saturate the metal ion, and which require the addition of another proligand, are considered non-macrocyclic for this purpose. As will be appreciated by those in the art, it is possible to covalent attach a number of "non-macrocyclic" ligands to form a coordinatively saturated compound, but that is lacking a cyclic skeleton.

Suitable sigma donating ligands using carbon, oxygen, sulfur and phosphorus are known in the art. For example, suitable sigma carbon donors are found in Cotton and Wilkinson, Advanced Organic Chemistry, 5th Edition, John Wiley & Sons, 1988, hereby incorporated by reference; see page 38, for example. Similarly, suitable oxygen ligands include crown ethers, water and others known in the art. Phosphines and substituted phosphines are also suitable; see page 38 of Cotton and Wilkinson.

The oxygen, sulfur, phosphorus and nitrogen-donating ligands are attached in such a manner as to allow the heteroatoms to serve as coordination atoms.

In addition, some embodiments utilize polydentate ligands that are polynucleating ligands, e.g. they are capable of binding more than one metal ion. These may be macrocyclic or non-macrocyclic. The molecular elements herein may also comprise polymers of the surface active moieties as outlined above; for example, porphyrin polymers (including polymers of porphyrin complexes), macrocycle complex polymers, surface active moieties comprising two surface active subunits, etc. can be utilized. The polymers can be homopolymers or heteropolymers, and can include any number of different mixtures (admixtures) of monomeric surface active moiety, wherein "monomer" can also include surface active moieties comprising two or more subunits (e.g. a sandwich coordination compound, a porphyrin derivative substituted with one or more ferrocenes, etc.). Surface active moiety polymers are described in WO 2005/086826, which is expressly incorporated by reference in its entirety.

In certain embodiments, the attachment group Y comprises an aryl functional group and/or an alkyl attachment group. In certain embodiments, the aryl functional group comprises a functional group selected from the group consisting of amino, alkylamino, bromo, iodo, hydroxy, hydroxymethyl, formyl, bromomethyl, vinyl, allyl, S-acetylthiomethyl, Se-acetylselenomethyl, ethynyl, 2-(trimethyl silyl)ethynyl, mercapto, mercaptomethyl, 4,4,5,5-tetramethyl-1,3,2-dioxaborolan-2-yl, and dihydroxyphosphoryl. In certain embodiments, the alkyl attachment group comprises a functional group selected from the group consisting of bromo, iodo, hydroxy, formyl, vinyl, mercapto, selenyl, S-acetylthio, Se-acetylseleno, ethynyl, 2-(trimethyl silyl) ethynyl, 4,4,5,5-tetramethyl-1,3,2-dioxaborolan-2-yl, and dihydroxyphosphoryl. In certain embodiments, the attachment group comprises an alcohol or a phosphonate.

In some embodiments, the surface active moieties are silanes, characterized by the formula, $A_{(4-x)}SiB_xY$, wherein each A is independently a hydrolysable group, e.g. a hydroxyl or alkoxy group, where $x=1$ to 3, and B is independently an alkyl or aryl group, that may or may not contain attachment groups, Y, as described above.

Embodiments of the present invention are suitable for use with many organic substrates. In an exemplary embodiment, the organic substrate may be comprised of any one or more of: electronic substrates, PCB substrates, semiconductor substrates, photovoltaic substrates, polymers, ceramics, carbon, epoxy, glass reinforced epoxy, phenol, polyimide resins, glass reinforced polyimide, cyanate, esters, Teflon, plastics, paints and mixtures thereof.

In another aspect, embodiments of the present invention provide a printed circuit board, comprising: at least one metal layer; at least one epoxy layer; and a stabilization layer formed between the metal layer and epoxy layer.

In some embodiments the stabilization layer is comprised of a metal oxide having a thickness of about 200 nanometers and less. In other embodiments the stabilization layer is comprised of a metal oxide exhibiting a substantially amorphous structure. In yet additional embodiments, the stabilization layer is comprised of a metal oxide having a thickness of about 150 nanometers and less and exhibiting a substantially amorphous structure.

Generally, the stabilization layer is comprised of a stabilization layer having grains, wherein the grains have a grain size in the range of 200 nanometers and less. In another embodiment the grains have a grain size in the range of 100 nanometers and less. Typically, but not exclusively, the metal oxide is comprised of copper oxide.

Of particular advantage, embodiments of the present invention provide an approach for treating a "smooth" metal substrate. In some embodiments the invention enables the use of a smooth metal substrate, meaning a metal substrate that has not been previously roughened. In the instance of a copper substrate, such a substrate can be from a variety of sources. For example, copper substrates suitable for use in methods of the present invention include, but are not limited to, electrolytic or electroplated copper, electroless copper, and rolled copper, and not restricted by the method of preparing the same.

In some embodiments the metal layer has a roughness of about 0.13 µm Ra. In some embodiments the formed copper oxide, or also referred to as "treated smooth copper surface" or the stabilization layer of the present invention, has a roughness of about 0.14 µm Ra thus demonstrating the method of the present invention does not significantly roughen the surface.

In further aspects, a printed circuit board is provided comprising a polymer material, such as an epoxy, which may contain a substantial amount of a filler material, such as glass, silica, or other materials, modified on its surface with a chemical adhesive material, such as a porphyrin, that substantially alters its chemical affinity for a metal, such as but not limited to copper, in order to facilitate strong adhesion between the polymer composite and the metal layer. A second layer of the chemical adhesive layer may be applied to the metal surface, to promote adhesion between it and subsequent polymer (epoxy/glass) layers. In some embodiments, the PCB is a multilayer conductive structure.

For example in one aspect, a printed circuit board is provided, comprising: at least one metal layer; a layer of organic molecules attached to the at least one metal layer; and an epoxy layer atop said layer of organic molecules. In some embodiments the at least one metal layer exhibits a peel strength of greater than 1.0 kg/cm and a surface roughness of less than 150 nm. In some embodiments, the at least one metal layer further comprises patterned metal lines formed thereon, wherein the patterned metals lines have a width of equal to and less than 25 microns. Additionally, patterned metal lines may have a width of equal to and less than 15 microns, 10 microns or 5 microns.

In another aspect of the present invention, a printed circuit board is provided having one or more metal layers and one or more epoxy layers formed thereon, characterized in that: at least one of said one or more metal layers exhibits a peel strength of greater than 1.0 kg/cm and a surface roughness of less than 150 nm. Embodiments of the present invention enable the formation of very small line widths. In some embodiments the metal layer is comprised of patterned metal lines formed thereon, said patterned metals lines having a width of equal to and less than 25 microns. In other embodiments the metal layer comprises patterned metal lines formed thereon, where the patterned metals lines have a width of equal to and less than 15 microns, and further less than 10 microns. In even further embodiments, patterned metal lines may be formed thereon wherein the patterned metals lines have a width of equal to and less than 5 microns.

In another aspect, the present invention provides methods of fabricating a printed circuit board, comprising the steps of: pre-cleaning a copper surface with an alkaline and/or peroxide solution; stabilizing the copper surface by forming a copper oxide layer thereon; terminating formation of the copper oxide by a self limiting reaction between the copper oxide and one or more surface modifier or inhibitor compounds; and bonding the treated copper surface with a resin. Is some embodiments, one or more molecules may be coupled to the copper oxide layer, the one or more organic molecules comprising a thermally stable base bearing one or more binding groups configured to bind the copper oxide surface and one or more attachment groups configured to attach to the resin.

Referring to FIG. 1A, there is illustrated one exemplary embodiment of a simplified schematic of a smooth metal-resin bonding interface 100A comprising a smooth metal substrate 102 bonded to a resin substrate 104. A stabilization layer 106 of either a dense oxide layer combined with or without an organic layer 108 is formed on top of the metal to prevent the metal surface from corrosion or chemical attack. In some embodiments it may be desirable, but not necessary, to facilitate chemical bonding by further conditioning or priming the stabilization layer with an organic molecular layer 108 to form active bonding sites X which will react with functional groups Y in the resin, forming covalent bonds. In the exemplary embodiment, the smooth metal-resin interface 100A possesses superior adhesion strength and resistance to heat, moisture, and chemical attacks; as compared to roughened copper-resin interface 100B shown in FIG. 1B which is known in the previous arts as having the interface bonding achieved mainly by mechanical anchors.

Referring to FIG. 2, in order to further illustrate the features of the present invention, an exemplary experimental process flow is schematically illustrated therein and comprises four major steps: (1) surface pre-treatment 200, (2) surface stabilization and conditioning and optional functionalization 210, (3) optional surface reduction (if necessary) 220, (4) vacuum lamination 240, and, (5) heat treatment (if necessary) 260. The specific sub-steps and experimental data are shown for illustrative purposes only and are not intended to limit the scope of the invention in any way. FIG. 2 also shows where in the process the peel strength tests are carried out, however this is shown only to illustrate the testing procedures. The broad method steps of the present invention do not include the peeling test steps.

In an exemplary method shown in FIG. 2, surface pre-treatment 200 is carried out by alkaline clean, rinsing, soft etching and acid clean, and rinsing and drying the substrate. Next the surface is stabilized at step 210. In this embodiment the surface is stabilized by surface oxidation. The step of surface oxidation comprises exposing the metal surface to an oxidant solution comprising one or more oxidants and one or more surface active moieties. This one step produces a stabilization layer of desired thickness and morphology. Optional functionalization may then occur, followed by rinsing and drying the substrate.

If necessary, optional reduction may occur at step 220. In one example, the sample is treated in a reducing bath of 40 g/L dimethylamine borane (DMAB) with pH adjusted to 12.6 at 35° C. for 2 minutes. This allows densification of the oxide layer and removes extra oxide. At this time, a molecular reagent can be used to functionalize the stabilization layer. The sample was then rinsed and dried by hot air.

After the stabilization step 210 and optional reduction step 220, vacuum lamination is carried out by assembling the laminate film over the stabilized substrate, applying vacuum lamination, and optional vacuum press is applied at step 240.

Next optional heat treatment 260 is performed to cure or anneal the laminated assembly. Peel strength testing may then be performed if desired.

Referring to FIGS. 3A and 3B, two separate embodiments of the present invention are schematically illustrated. For example in FIG. 3A a metal 300 is treated with a standard surface oxidation to form an oxide layer 310. Oxide layer growth occurs by conventional means such as by chemical or thermal oxidation. After formation of the oxide layer 310 the oxide layer 310 is reduced to form stabilization layer 320 of the present invention. A molecular reagent is optionally added to the reductant treatment solution to form the stabilization layer 320. FIG. 3B shows an alternative embodiment where a metal 350 is treated with a molecular reagent optionally added to an oxidant during an oxidation step to limit the growth of the oxide layer and thereby form a stabilization layer 360. In both cases, adhesion of subsequent layers is enhanced by the presence of the stabilization layer 320, 360 without causing significant roughening of the metal surface.

In another aspect, the present invention can be utilized in a significant number of applications. In one such example, embodiments of the present invention can be used to form protective coatings. In some embodiments, methods of the present invention wherein a molecular component that modifies the surface, is added to one of the treatments solutions (e.g., oxidation bath or reduction bath), are provided which greatly simplify the preparation of the metal surface. Since the MI chemistry works in the presence of other reagents (e.g., oxidants or reductants), the process is shorter and provides more uniform coverage and stability. It can dramatically reduce the cost of the surface preparation process and provide additional features (such as greater smoothness and/or enhanced reliability of adhesion of subsequent layers) for the modified metal surface. The modified surfaces can be used as is, or can be modified with other, established chemistries to provide additional functionality. Embodiments of the present invention are also useful with other materials that form stable oxides, including silica, alumina, or zirconia. A short list of applications according to some embodiments of the present invention include, but are not limited to, the following:

Alkali- and scratch-resistant hard coating-bonded substrates, coating solutions for them, and manufacture of polymer coupler-coated metal oxide particles for them;

Organic/inorganic hybrid polyimide compositions resistant to atomic oxygen;

Coatings for automobile power cables, and process for making the compositions;

Sealing compositions containing surface-treated inorganic materials for liquid crystal display panels;

Adhesives for metal plates. The adhesive should have high shear strength and high peeling strength. The metal composite plate using the adhesive has high damping coefficient and can be used for of damping/sound-muffling sheets;

Water-repellent coatings on glass plates for vehicle or architectural window. A water-repellent glass plate for vehicle or paned windows is fabricated by covering the glass surface with a repellent coating covalently bonded to the surface;

Preparation of compatible gelatin-epoxy alumina composite membrane for protein separation. The coating should have has good hydrophilicity and biocompatibility, and can be widely used in many kinds of chemical separations;

Manufacture of resin-coated substrates, prepregs, and resin-coated metal foils;

Aggregation-free, surface-treated inorganic powders. The inorganic powders are surface-treated with organic compounds which have polar parts and nonpolar parts and are liquid at ambient temp. The powders may also be surface-treated with coupling agents. The surface-treated inorganic powders are dispersed in resin compositions for use as EMC (epoxy molding compd.), liquid sealants, substrate materials, adhesives for electronic parts, resin compounds, or coatings;

Multifunctional Polymers for Persistent Surface Derivatization and Their Antimicrobial Properties. These require covalent surface anchoring and polymer crosslinking that is capable of forming long-lasting coatings on reactive and nonreactive surfaces. Polymers containing reactive groups form strong links to oxide surfaces, thereby anchoring the polymer chains at multiple points;

Transparent gas-barrier films with good adhesion between plastic substrates and inorganic layers for packaging materials;

Aluminum electrode foil surface that must be resistant to negative substances and react with molecular coupling agents that can used as electrodes for batteries and/or capacitors;

Functional microparticles-modified melt-blown nonwoven fabric. The production method requires surface-modified functional microparticles combined with melting and extruding the resin slices by conventional processes;

Nanostructured fumed metal oxides for thermal interface pastes, which are effective as thermally insulating solid components in thermal pastes.

A chrome-free composition useful for the surface treatment of a steel sheet, which imparts excellent anti-corrosive property, processability, workability, powder coating property and lubrication property to a steel sheet coated with the same. The composition for surface treatment solution having excellent powder coating property, which comprises acrylic urethane resin, colloidal composite oxide, molecular coupling agent, silica and isocyanate crosslinking agent, and method for producing plated steel sheet coated with the same;

Semiconductor device fabrication comprises a void-type receiving layer on a substrate and a Si film formed on the receiving layer by using a porous film containing silica, alumina, and/or alumina hydrate coated with a metal;

Surface modification of nano/micro particle hybrid composites for scratch and abrasion resistant polyacrylate coatings using SAMs to promote dispersion;

Fluoropolymer-coated galvanized steel plates with good lubricating properties and their manufacture;

Scratch resistant coating materials containing surface-modified aluminum oxide nanoparticles. Coating materials with improved scratch resistance contain an organic binder, such as aq. acrylic, two component polyurethane or UV-curable binder, additives and surface-modified aluminum oxide nanoparticles;

Improved electroless plating of copper with high adhesion to nickel plating. The electroless plating method is carried out by the following steps: (1) treating a substrate to be plated with a SAM coupling agent, (2) immersing the treated substrate in a Ni plating bath for electroless plating of Ni on the treated surface of the substrate, and (3) immersing the Ni-plated substrate in a Cu plating bath with pH≤10 for electroless plating of Cu on the Ni plating. The Ni plating has high adhesion to the substrate, and the Cu plating has high adhesion to the Ni plating;

Improved stability of surface modifiers on alumina nanoporous membranes. Stability of SAMs covalently bound to the surface of nanoporous alumina membranes. may dramatically improve the stability of immobilized molecules;

Improved Resin Bond Strength to Silica-Coated Ti Substrate;

Application to nylon composite containing copper oxide particles to obtain high friction coefficient materials. The existing process method comprises (1) treating copper oxide particles and aluminum oxide particles with surface coupling agent in acetone, drying, and grinding; (2) treating carbon fiber in air for oxidation; (3) mixing treated copper oxide particles, aluminum oxide particles, carbon fiber, and nylon in a ball mill for 6-8 h; and following the standard procedure; and Improved coating for lamps comprising a network obtainable by conversion of a SAM-modified surface by means of a sol-gel process, is described where silica particles obtainable from an acid-stabilized colloidal silica dispersion are substantially incorporated in the network.

EXPERIMENTAL

A number of experiments were conducted as described below. These examples are shown for illustration purposes only and are not intended to limit the invention in any way.

EXAMPLES

Example 1: Treatment of a Smooth Copper Substrate

This example illustrates one exemplary approach for treating a smooth copper substrate according to some embodiments of the present invention. As discussed above, methods of the invention enable the use of a treated smooth metal substrate, meaning a metal substrate that has not been previously roughened. In one example, the metal surface is copper, and in particular a smooth copper surface, meaning a copper substrate that has not been previously roughened. Such a copper substrate can be from a variety of sources. For example, copper substrates suitable for use in methods of the present invention include, but are not limited to, electrolytic or electroplated copper, electroless copper, and rolled copper, and not restricted by the method of preparing the same In this Example 1, an electrolytic copper substrate was first cleaned with 20-40 g/L sodium hydroxide solution at 40-60° C. for 2-5 minutes, and then rinsed with water. The copper substrate was further cleaned in 1-3 wt % hydrogen peroxide solution plus 2-5 wt % sulfuric acid at RT for 1-5 minute, and 5-20 wt % sulfuric acid solution at RT for 1 minute, and then followed by water rinse. The substrate was then stabilized by oxidation in a 140-200 g/L chlorite solution with 10-50 g/L sodium hydroxide containing less than 1% of a SAM at 50-80° C. for 2-8 minutes followed by water rinse. The sample can then be treated in a reducing bath of 10-40 g/L dimethylamine borane (DMAB) with pH adjusted to 10.5-12.5 at RT-40° C. for 2-5 minutes. The sample was then rinsed and dried by hot air. The surface morphology and the thickness of the stabilization layer can be adjusted by varying the concentrations of the treatment solutions, the temperature, and duration, and characterized by SEM, XRD, and Auger depth profile.

FIG. 4A is an exemplary SEM micrograph at a magnification of 50,000 showing the morphology of a conventional electrolytic copper surface (i.e. a smooth copper surface, or in other words a copper surface that has not been roughened) with nodular grains and directional grain growth reflecting the long range order of the crystalline structure. In comparison, the morphology of an electrolytic copper surface treated according to the methods of the present invention forming the stabilization layer thereon is shown in FIG. 4B. As is very apparent, the stabilization layer on the treated copper surface shown in FIG. 4B exhibits a morphology of finer grains, unidirectional grain growth, and greater uniformity. By contrast, FIG. 4C shows a conventional black oxide surface which exhibits a much thicker and fragile fibrous structure. FIG. 4D is an exemplary SEM micrograph of a conventional micro-etched copper surface which shows morphology of highly un-uniform micro-ravines and ridges.

The tabular data of FIG. 5 compares the surface roughness expressed in both Ra and Rz, and demonstrates that the treatment of the present invention does not roughen the copper surface, unlike conventional oxidation and reduction processes, which roughen the surface considerably.

The stabilization layer of the treated smooth copper surface prepared according to Example 1 was further characterized by Auger Electron Spectroscopy (AES) to determine the surface composition and thickness distribution of the layer. Referring to FIG. 6, the AES depth profile for the treated smooth copper surface shows that the stabilization layer contains mixed copper and copper oxide, presumably cuprous oxide, and its thickness is about 100 nm. In contrast, the conventional black oxide layer extends to a distance above 1000 nm. The thickness of the stabilization layer is desired to be within a range of about 100 to 200 nm for securing good bonding strength.

Figure 7:
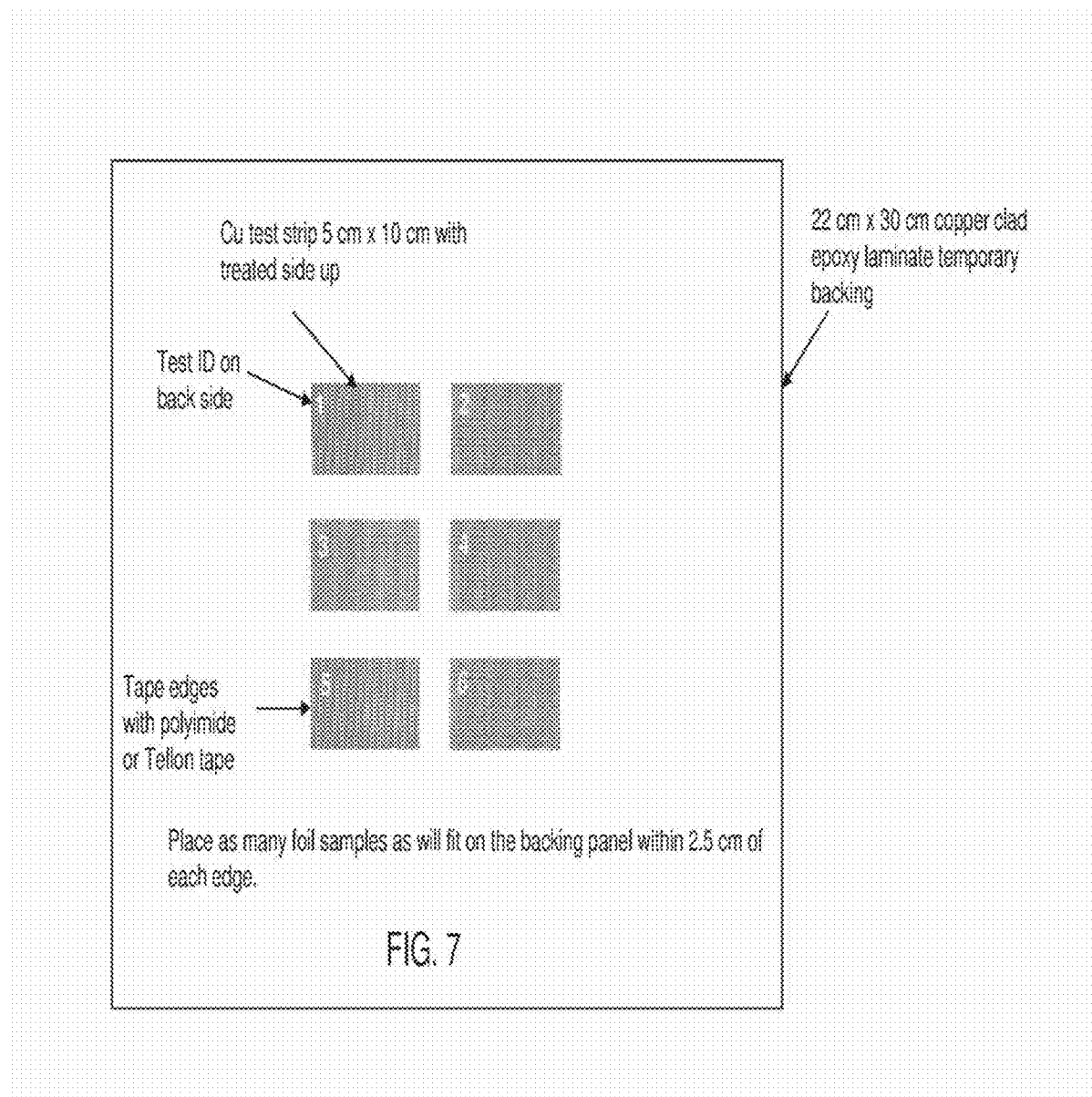
FIG. 7 is an example of a test sample layout used to conduct peel strength tests on copper test strips on an epoxy substrate.

Example 2: Demonstration of the Enhancement of Resin Bonding on a Smooth Copper Substrate This example illustrates one exemplary approach to enhance the adhesion of epoxy on a smooth copper substrate. The above-mentioned treated Cu test strips were laid out on a temporary backing as illustrated in FIG. 7. A commercial build-up (BU) epoxy (or dielectric) laminate film of 35 μm thickness, which had been stabilized at ambient condition for at least 3 hours, was laid on top of the Cu strips as illustrated by the schematic steps shown in FIGS. 8A to 8D. The assembly was then vacuum laminated at 100° C., 30 s vacuum, and 30 s press at 3 Kg/cm². The lamination step was repeated twice to form a total of 3 plies of BU films.

It is worthy to note that the copper surface changed from reddish into a light brown or green after surface treatment, and then became black after the lamination suggesting that a chemical bonding reaction had taken place. The resin surface contains chemically reactive groups, such as hydroxyls, amines, epoxies, and others, which can react with the oxygen rich copper surface by forming bonds.

To quantify the adhesion strength, a rigid backing substrate (stiffener) was laminated on top of the BU film as illustrated by FIG. 8B. The assembly was then heat treated or cured in a convection oven at 180° C. for 90 min.

Figures 9A, 9B:
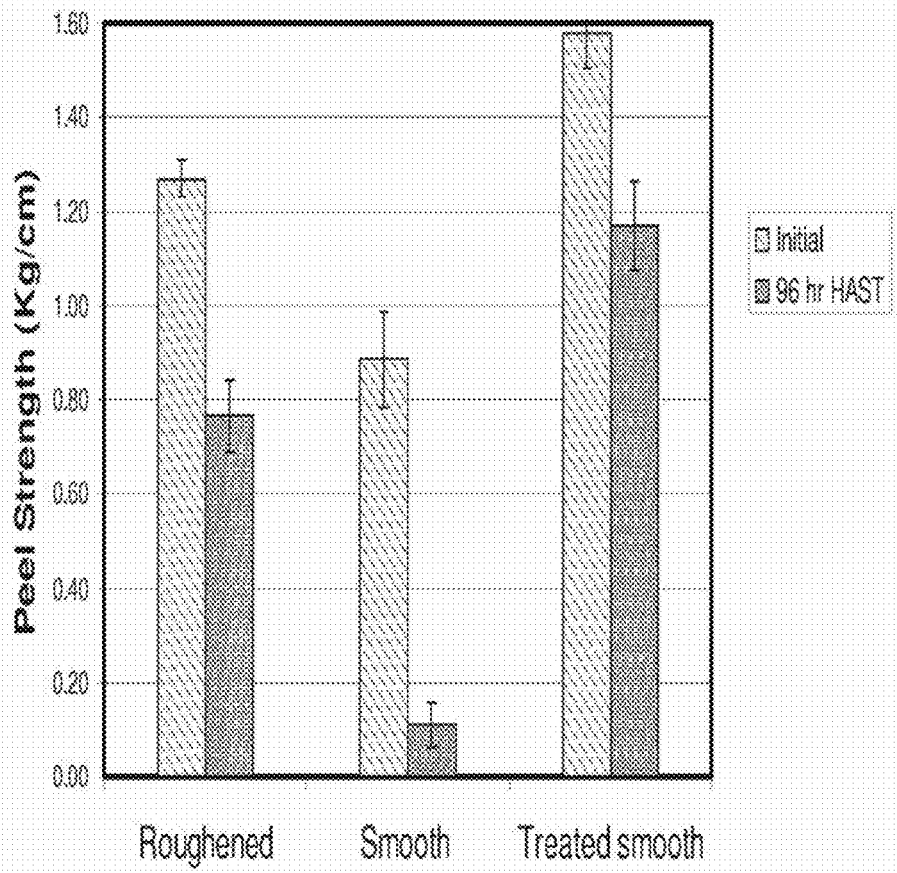
FIGS. 9A and 9B illustrate peel strength and surface roughness for epoxy laminated smooth copper surfaces treated according to embodiments the present invention (referred to as "treated smooth"), as compared to control smooth copper substrates and conventional roughened copper surfaces.

Next the assembly was diced to remove the temporary backing substrate and separate into individual test coupons for peel strength testing and testing using the highly accelerated stress test (HAST). The adhesion strength of the resulting laminate was quantified by a force gauge of a peel tester on a peel strip of 10 mm width at a 90 degree peel angle and peel speed of 50 mm/min. Specifically, peel strength was tested on the substrates as initially formed, and then after preconditioning and reflow. Preconditioning was carried out at 125° C. for 25 hours, followed by 30° C. and 60% relative humidity (RH) for 192 hours. Reflow was carried out three times at 260° C. Thereafter HAST testing was conducted at 130° C. and 85% RH for 96 hours. FIGS. 9A and 9B illustrate the impact of the treatment on the peel strength retention post HAST testing. The smooth control without (i.e. without a stabilization layer according the invention) dropped 88% in peel strength post HAST, and the conventional roughened control showed a 40% loss. In significant contrast the treated smooth copper substrate (i.e. with the stabilization layer formed according to the invention) showed not only higher initial peel strength but also a higher retention of only 26% loss. The tabular data of FIG. 9B also demonstrate that the enhancement in peel strength stability was achieved without a significant change in the surface roughness. This result is superior, and would not have been predicted, according to the teaching of the prior art.

Of significant advantage embodiments of the present invention provide a stable, controllable process window. Such a stable process window provides a robust, repeatable process. FIG. 10 illustrates the reproducibility or robustness of peel strength and HAST stability for five batches of samples of epoxy laminated smooth copper surfaces treated according to embodiments the present invention. FIGS. 11A and 11B show SEM cross-sectional views of laminated treated smooth copper surface with stabilization layer according to embodiments of the present invention before and after HAST as compared to a standard roughened surface, further demonstrating that methods of the present invention do not significantly roughen the copper surface and that no delamination occurs after reflow and HAST reliability tests.

FIGS. 12A and 12B are exemplary SEM micrographs of peeled copper surfaces showing that the copper-resin interface breaks right at the copper surface for a smooth copper control (FIG. 12A), whereas the interface breaks within the resin for a treated smooth copper with stabilization layer (FIG. 12B) formed according to methods of the present invention. The surprising result demonstrates that the bonding strength between the resin and the treated copper surface of the present invention is stronger than the bonding strength of the bulk resin materials themselves.

Example 3: Demonstration of Fine Line Patterning and Electrical Isolation Reliability Devices were formed to demonstrate that patterning of fine lines is enabled by embodiments of the present invention. Specifically, comb patterns of lines and spaces with equal dimensions (50/50, 30/30, 20/20, 10/10, and 8/8 μm) were treated and laminated following the same procedures as described in Example 1 and Example 2. SEM cross-sectional views confirmed again that the methods of the invention did not roughen the copper lines and there was no delamination after reflow and HAST tests. The electrical isolation resistance remained at above $10^{12} \Omega$ at 2 V after reflow and HAST, which is five orders of magnitude higher than that of PCB manufacturing specifications. Table 1 below summarizes the results. Good results were obtained on all of these structures, indicating that treatment of the present invention significantly improves the ability to pattern copper lines at fine line spacing, a significant advance in the art.

TABLE 1

Fine line patterning and electrical isolation reliability

| Line/Space Dimension (um) | No Delamination post HAST | Isolation Resistance post HAST ×10$^{12}$ Ω at 2 V |
|---|---|---|
| 50/50 micron | Pass | 1.27 |
| 30/30 micron | Pass | 1.30 |
| 20/20 micron | Pass | 1.43 |
| 10/10 micron | Pass | 1.29 |
| 8/8 micron | Pass | 1.10 |

Figure 13:
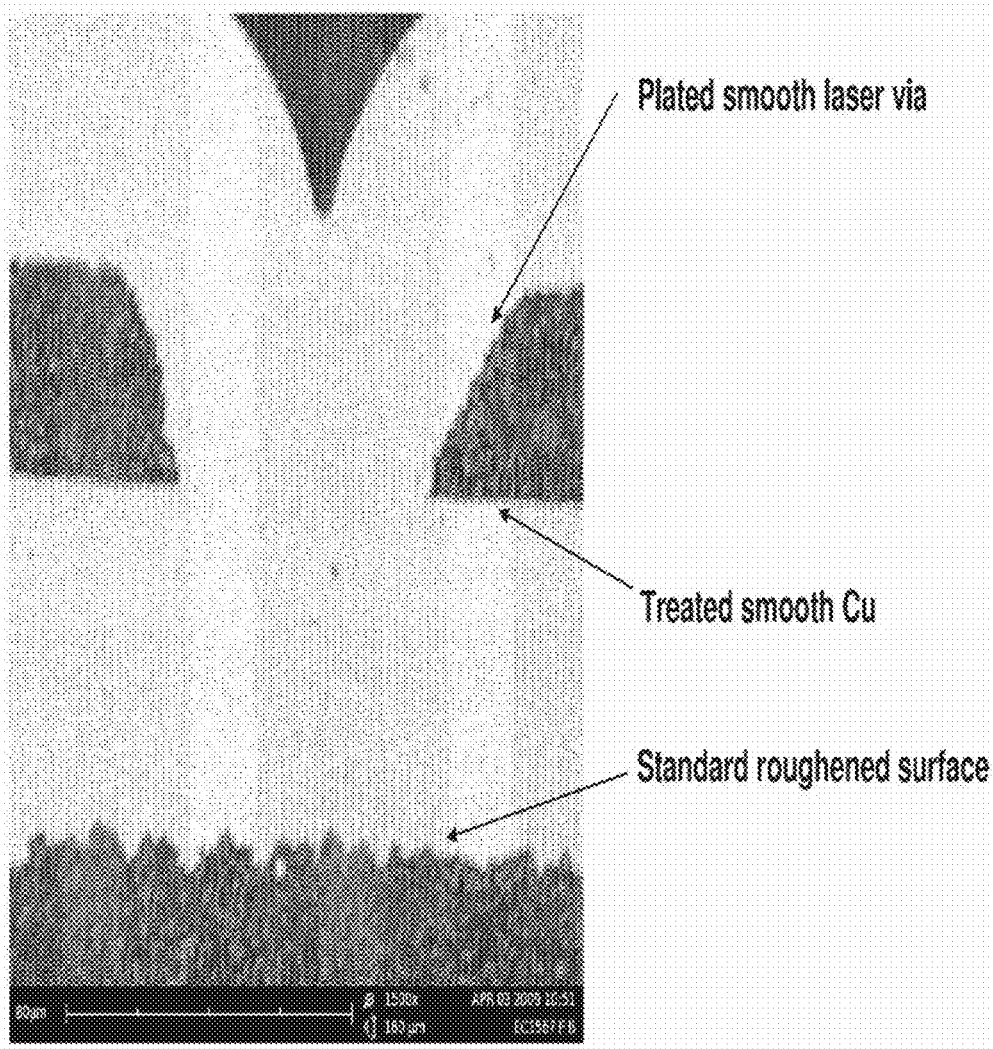
FIG. 13 is a SEM photograph showing a cross-section of a laser via formed on laminated treated smooth copper surface according to embodiments of the present invention demonstrating that no undercutting occurs after the desmear and plating processes.

Example 4: Demonstration of Laser Drilling and Via Clean/Plating Compatibility of Epoxy Laminated Cu Surface Devices with laser vias were formed and then further processed to demonstrate process compatibility. Specifically, smooth copper substrates were treated and laminated following the same procedures as described in Example 1 and Example 2. Via arrays of 30, 40, 50, 75, 100, 150, and 200 μm diameter were prepared through $CO_2$ and UV laser drilling. The via structures were then subjected to a soft etch and acid clean or desmear process followed by electroless copper plating and then electroplating. FIG. 13 shows SEM cross-sections of laser vias formed on laminated smooth treated copper surfaces formed according to embodiments of the present invention demonstrating no undercutting and delamination post desmear and plating processes.

Example 5: Demonstration of the Enhancement of Solder Resist Bonding on a Smooth Copper Substrate This example illustrates one exemplary approach to enhance the adhesion of solder resist on smooth copper substrates. The smooth copper test strips were treated following the same procedures as described in Example 1 and laid out on a temporary backing as illustrated in FIG. 7. A commercial solder resist (SR) laminate film of 30 μm thickness, which had been stabilized at ambient condition for at least 3 hours, was laid on top of the copper strips as illustrated by FIG. 8A. The assembly was then vacuum laminated at 75° C., 30 s vacuum, and 60 s press at 1 Kg/cm$^2$. The assembly was then subjected to 400 mJ/cm$^2$ UV exposure followed by curing in a convection oven at 150° C. for 60 min and post UV curing at 1000 mJ/cm$^2$.

To quantify the adhesion strength, a rigid backing substrate (stiffener) was laminated on top of the SR film as illustrated by step 2 of FIG. 8B. The assembly was then diced to remove the temporary backing substrate and then separated into individual test coupons for peel strength testing and highly accelerated stress test (HAST) testing. Specifically, peel strength was tested on the substrates as initially formed, and then after preconditioning, reflow, and HAST. FIGS. 14A and 14B illustrate the impact of the treatment methods of the present invention on the peel strength retention post HAST testing. The smooth control without treatment dropped 87% in peel strength post HAST, and the conventional roughened control showed 69% loss.

In significant contrast the treated smooth copper surface formed according to embodiments of the present invention showed not only higher initial peel strength but also a higher retention of only 22% loss. The tabular data of FIG. 14B also demonstrates that the enhancement in peel strength stability was achieved without significant change in surface roughness.

Figure 15A:
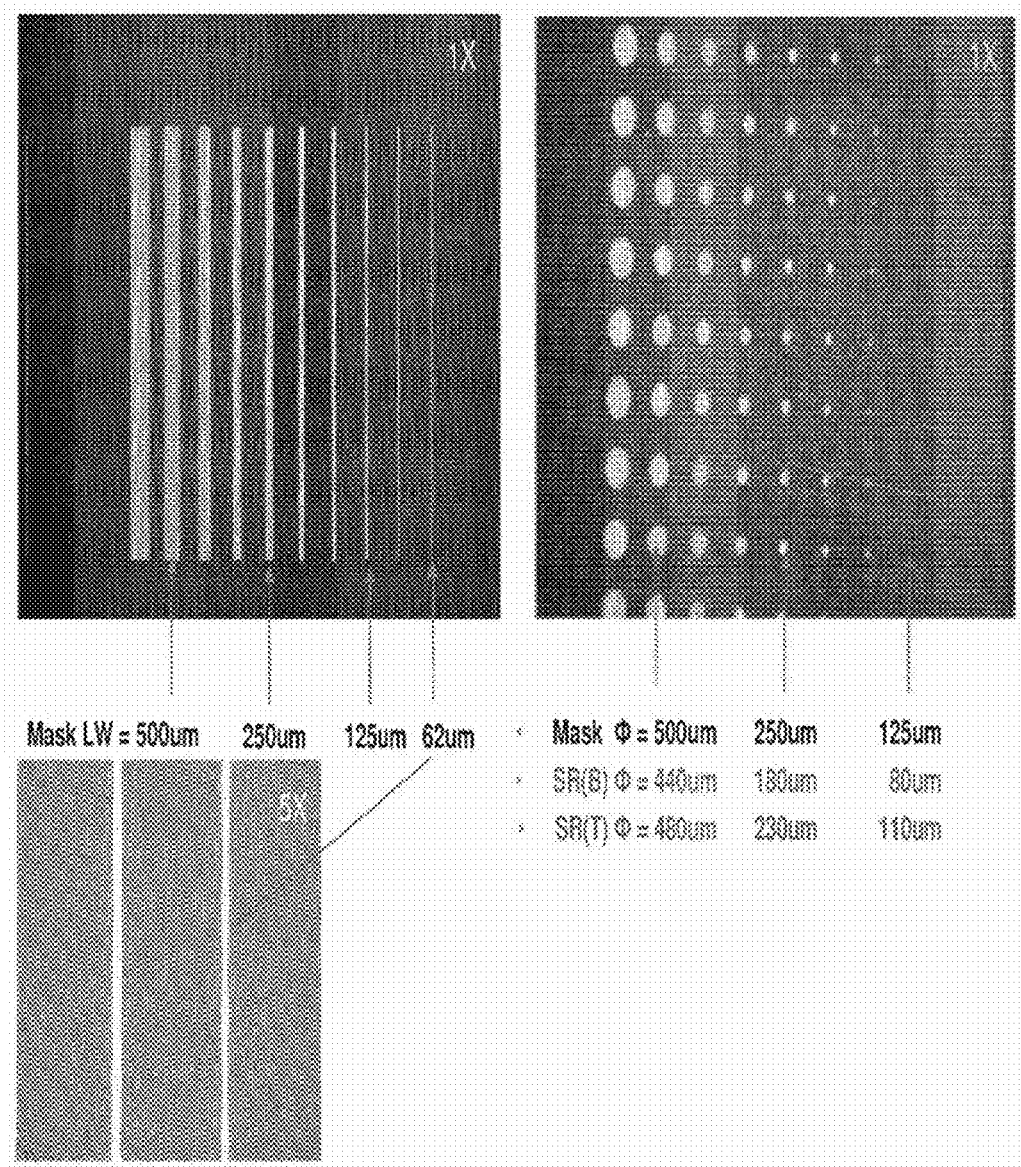
FIGS. 15A and 15B show photos of SR pattern of copper lines and via arrays (16A) and BGA pattern (16B)
Figure 15B:
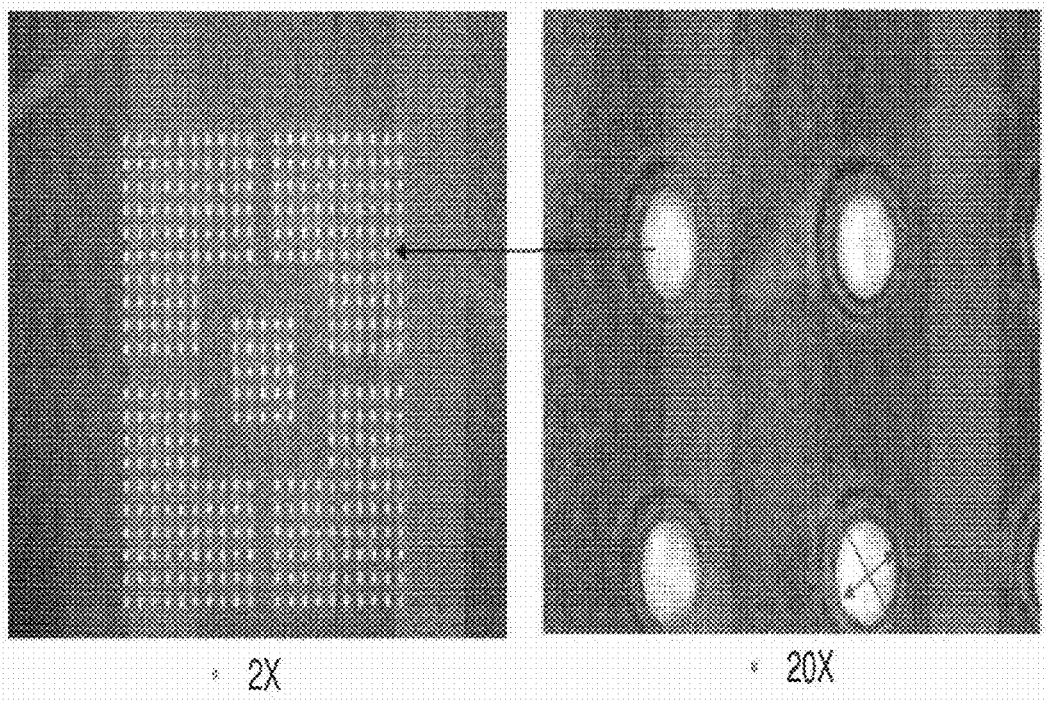
Figure 16:
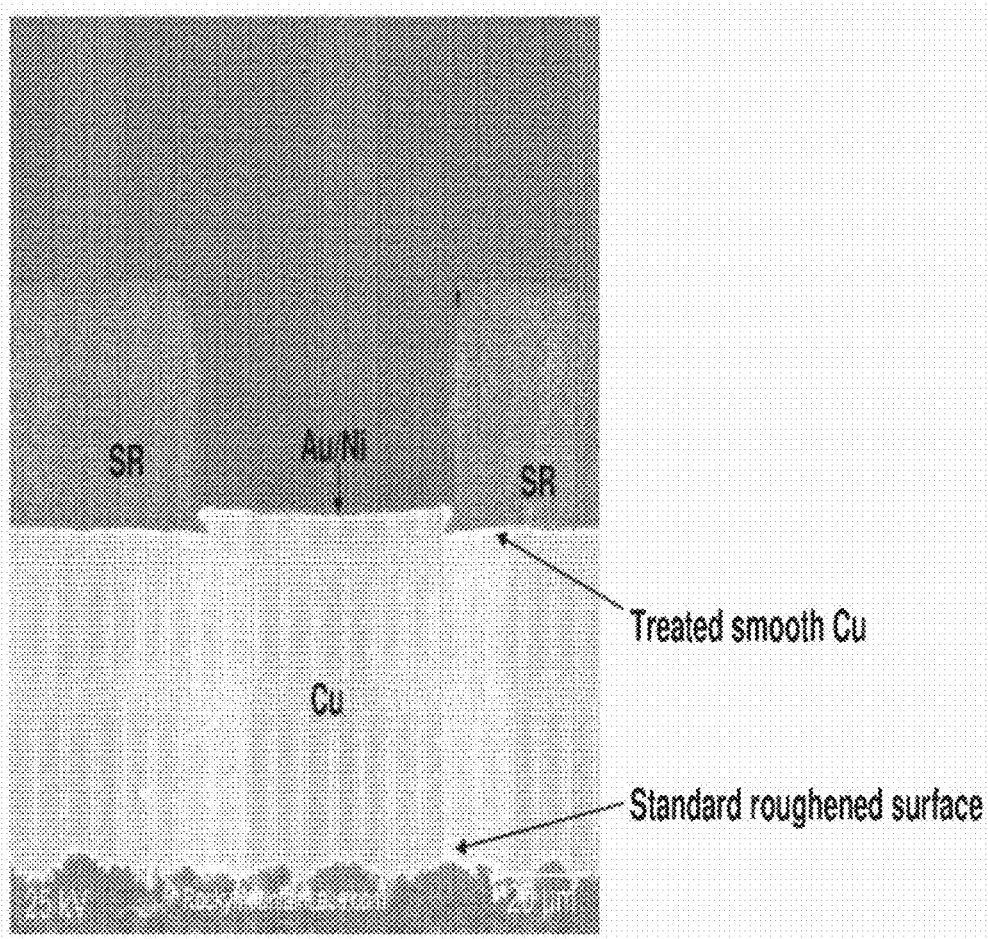
FIG. 16 is a SEM photograph of a cross-section of a SR via formed on a laminated treated copper surface formed according to embodiments of the present invention, which demonstrates that no delamination occurs post desmear processing and plating.

Example 6: Demonstration of UV Patterning and Via Clean/Plating Compatibility of SR Laminated Cu Surface Devices of via array and copper lines were formed and then further processed to demonstrate the process compatibility. Specifically, smooth copper substrates were treated and laminated following the same procedures as described in Example 5. Via arrays of bottom diameter ranging from 80 to 440 μm and copper lines of 62 to 500 μm width were formed through UV exposure and development. FIG. 15A shows the copper line pattern and via arrays, and FIG. 15B shows the ball grid array (BGA) pattern. The patterned structures were then subjected to a soft etch and an acid clean or desmear process followed by electroless Ni plating and then Au emersion deposition. FIG. 16 shows SEM cross-sections of SR vias formed on laminated smooth copper demonstrating no delamination post desmear and plating processes. Good results were obtained on all of these structures, suggesting that treatment methods of the present invention significantly improved the ability to pattern SR at fine line spacing, a significant advance in the art.

In summary, a number of inventive embodiments are provided herein. In some embodiments, a method of treating a metal surface to promote adhesion between the metal surface and an organic material is provided characterized in that: a metal oxide layer is formed on the metal surface, and formation of the metal oxide layer is controlled by a self-limiting reaction between the metal oxide and a surface modifier compound. Formation of the metal oxide layer may be controlled such that the metal oxide layer has a thickness of about 200 nanometers and less, or optionally a thickness in the range of about 100 nanometers to 200 nanometers. Formation of the metal oxide layer may be controlled such that the metal oxide layer has morphology comprised of a substantially amorphous structure. In some embodiments, the metal oxide layer has grains of a size in the range of 250 nanometers and less, or optionally in the range of 200 nanometers and less. The grains may be substantially randomly oriented after conditioning. The metal oxide layer may be comprised of copper oxide.

In some embodiments the metal oxide layer is formed by exposing the metal surface to an oxidant. The oxidant may be selected from any one or more of: sodium chlorite, hydrogen peroxide, permanganate, perchlorate, persulphate, ozone, or mixtures thereof.

In some embodiments the surface modifier compound is selected from compounds that react with metal oxide surfaces to control the reaction rate as the metal oxide is forming. The surface modifier compound may be selected to such that it eventually slows and terminates the oxidation reaction. The method may be carried out at a temperature in the range of room temperature to about 80° C. In some embodiments the self limiting reaction becomes stable after about 2 to 15 minutes.

In another aspect, a method of treating a metal surface to promote adhesion between the metal surface and an organic material is provided comprising the steps of: oxidizing the metal surface to form a metal oxide layer on the metal surface; and terminating growth of the metal oxide layer by a self limiting reaction between the metal oxide layer and a surface modifier compound. In some embodiments, the steps of oxidizing and terminating oxidation further comprises exposing the metal surface to a solution comprising an oxidant and surface modifier compound. Optionally, methods further include contacting the metal surface with one or more organic molecules comprising a thermally stable base bearing one or more binding groups configured to bind the metal surface and one or more attachment groups configured to attach to the organic material.

In some embodiments, the one or more organic molecules is a surface active moiety or molecule. In some embodiments the one or more surface organic molecules is selected from the group of: a porphyrin, a porphyrinic macrocycle, an expanded porphyrin, a contracted porphyrin, a linear porphyrin polymer, a porphyrinic sandwich coordination complex, or a porphyrin array. The surface active moiety may be selected from the group consisting of a macrocyclic proligand, a macrocyclic complex, a sandwich coordination complex and polymers thereof.

The attachment group may be comprised of an aryl functional group and/or an alkyl attachment group. In some embodiments the aryl functional group is comprised of a functional group selected from any one or more of: acetate, alkylamino, allyl, amine, amino, bromo, bromomethyl, carbonyl, carboxylate, carboxylic acid, dihydroxyphosphoryl, epoxide, ester, ether, ethynyl, formyl, hydroxy, hydroxymethyl, iodo, mercapto, mercaptomethyl, Se-acetylseleno, Se-acetylselenomethyl, S-acetylthio, S-acetylthiomethyl, selenyl, 4,4,5,5-tetramethyl-1,3,2-dioxaborolan-2-yl, 2-(trimethylsilyl)ethynyl, vinyl, and combinations thereof. In some embodiments the alkyl attachment group comprises a functional group selected from any one or more of: acetate, alkylamino, allyl, amine, amino, bromo, bromomethyl, carbonyl, carboxylate, carboxylic acid, dihydroxyphosphoryl, epoxide, ester, ether, ethynyl, formyl, hydroxy, hydroxymethyl, iodo, mercapto, mercaptomethyl, Se-acetylseleno, Se-acetylselenomethyl, S-acetylthio, S-acetylthiomethyl, selenyl, 4,4,5,5-tetramethyl-1,3,2-dioxaborolan-2-yl, 2-(trimethylsilyl)ethynyl, vinyl, and combinations thereof. In one example, the at least one attachment group is comprised of an alcohol or a phosphonate. In another embodiment, the at least one attachment group is comprised of any one of more of: amines, alcohols, ethers, other nucleophile, phenyl ethynes, phenyl allylic groups, phosphonates and combinations thereof.

In some embodiments methods of forming a coating on a metal surface are provided characterized in that: a metal oxide layer is formed on the metal surface, and formation of the metal oxide layer is controlled by a self-limiting reaction between the metal oxide and a surface modifier compound.

In other embodiments, methods of forming a coating on a metal surface are provided, comprising the steps of: oxidizing the metal surface to form a metal oxide layer on the metal surface; and terminating growth of the metal oxide layer by a self limiting reaction between the metal oxide layer and a surface modifier compound.

Further, methods of forming a coating on a metal surface are provided, comprising the steps of: stabilizing the metal surface; and conditioning the stabilized metal surface.

In another aspect of the present invention, a printed circuit board is provided, comprising: at least one metal layer; at least one epoxy layer; and a stabilization layer formed between the metal layer and epoxy layer. The stabilization layer may be comprised of a metal oxide having a thickness of about 200 nanometers and less. In some embodiments the stabilization layer is comprised of a metal oxide exhibiting a substantially amorphous structure. In some embodiments the stabilization layer is comprised of a metal oxide having a thickness of about 200 nanometers and less and exhibiting a substantially amorphous structure. The stabilization layer may further be comprised of a metal oxide layer having grains, wherein the grains have a grain size in the range of 250 nanometers and less, or optionally have a grain size in the range of 200 nanometers and less. In some embodiments the metal oxide is comprised of copper oxide. The metal layer may have a roughness of up to about 0.14 µm Ra, and the metal oxide may have a roughness of up to about 0.14 µm Ra.

In some embodiments the metal layer further comprises patterned metal lines formed thereon, said patterned metals lines having a width of equal to and less than about 25 microns, optionally the patterned metal lines have a width of equal to and less than about 15 microns, and optionally the patterned metal lines have a width of equal to and less than about 10 microns, and further optionally the patterned metal lines have a width of equal to and less than about 5 microns.

In another aspect, a method of fabricating a printed circuit board is provided, comprising the steps of: pre-cleaning a copper surface with an alkaline and/or peroxide solution; stabilizing the copper surface by forming a copper oxide layer thereon; terminating formation of the copper oxide by a self limiting reaction between the copper oxide and one or more surface modifier compounds; and bonding the treated copper surface with a resin.

In some embodiments a method of controlling the growth of an oxide layer on the surface of a metal is provided comprising: terminating growth of the oxide layer by a self limiting reaction between the oxide layer and one or more surface modifier compounds.

Embodiments of the present invention further provide an oxidant composition, comprising one or more oxidants; and one or more surface modifier compounds. In some embodiments the surface modifier compound is selected from one or more surface active molecules (SAMs) as described above.

Further, methods of treating a metal surface to promote adhesion or binding between the metal surface and an organic material are provided characterized in that: the metal surface is stabilized by forming a metal oxide layer thereon, and then the metal oxide layer is conditioned with a reducing agent to achieve selective oxide thickness and morphology. In some embodiments the reducing agent is selected from any one or more of: formaldehyde, sodium thiosulfate, sodium borohydride a borane reducing agent comprised of the general formula: $BH_3NHRR'$, wherein R and R' are each selected from the group consisting of: H, $CH_3$ and $CH_2CH_3$, such as a cyclic borane, morpholine borane, pyridium borane, piperidine borane, or dimethylamine borane (DMAB).

In some embodiments stabilizing the metal surface is carried out at a temperature in the range of room temperature to about 80° C., or optionally at a temperature in the range of room temperature to about 50° C. In some embodiments the method is carried out for a time in the range of about 2 to 20 minutes.

In another aspect, methods of treating a metal surface to promote adhesion between the metal surface and an organic material are provided, comprising the steps of: stabilizing the metal surface; and conditioning the stabilized metal surface. In one example, stabilizing the metal surface comprises forming a metal oxide layer on the metal surface. In one example, the step of conditioning the metal surface comprises reducing the metal oxide layer with a reducing agent. In some embodiments, the metal oxide layer after conditioning has a thickness of about 200 nanometers and less. In some embodiments, the metal oxide layer after conditioning is comprised of a substantially amorphous structure. The metal oxide layer may have grains, and after conditioning the grains have a size in the range of 250 nanometers and less, or optionally in the range of 200 nanometers and less. In some embodiments the grains become substantially randomly oriented after conditioning. In one example, the metal oxide layer is comprised of copper oxide.

In one aspect, after conditioning the metal surface is contacted with one or more organic molecules comprising a thermally stable base bearing the one or more binding groups configured to bind the metal surface and the one or more attachment groups configured to attach to the organic material. In some embodiments the organic material is comprised of any one of more of: electronic substrates, PCB substrates, semiconductor substrates, photovoltaic substrates, polymers, ceramics, carbon, epoxy, glass reinforced epoxy, phenol, polyimide resins, glass reinforced polyimide, cyanate, esters, Teflon, plastics and mixtures thereof.

In yet a further aspect, methods of fabricating a printed circuit board are provided, comprising the steps of: pre-cleaning a copper surface with an alkaline and/or peroxide solution; stabilizing the copper surface by forming a copper oxide layer thereon; conditioning the copper oxide layer with a reducing agent; and bonding the treated copper surface with a resin. Additionally, a further step of coupling one or more molecules to the copper oxide layer is provided, the one or more organic molecules comprising a thermally stable base bearing one or more binding groups configured to bind the copper oxide surface and one or more attachment groups configured to attach to the resin.

The foregoing methods, devices and description are intended to be illustrative. In view of the teachings provided herein, other approaches will be evident to those of skill in the relevant art, and such approaches are intended to fall within the scope of the present invention.

We claim:
1. A method of fabricating a printed circuit board, comprising the steps of:
  a. stabilizing a copper surface by forming a copper oxide layer thereon;
  b. conditioning the copper oxide layer with a reducing agent, the reducing agent is selected from any one or more of formaldehyde, sodium thiosulfate, sodium borohydride, a borane reducing agent represented by the general formula BH$_3$NHRR', wherein R and R' are each selected from the group consisting of H, CH$_3$ and CH$_2$CH$_3$, dimethylamine borane (DMAB), a cyclic borane, morpholine borane, pyridium borane, and piperidine borane; and
  c. coupling one or more organic molecules to the copper oxide layer, the one or more organic molecules comprising a thermally stable base bearing one or more binding groups configured to bind the copper oxide surface and one or more attachment groups configured to attach to a resin,
  wherein the stabilizing and the conditioning are carried out so as to not roughen the metal surface relative to the roughness of the metal surface prior to the stabilizing.

2. The method of claim 1 characterized in that the copper surface is pre-cleaned with an alkaline and/or peroxide solution.

3. The method of claim 1 characterized in that the treated copper surface is bonded to the resin.

4. The method of claim 1 characterized in that the formed stabilization layer has a thickness of about 200 nanometers or less.

5. The method of claim 1 characterized in that the stabilization layer has a morphology comprised of a substantially amorphous structure.

6. The method of claim 1 characterized in that the stabilization layer has a highly distributed grain structure, and after conditioning the grains have a size in the range of 200 nanometers or less.

7. The method of claim 1 characterized in that the copper oxide has grains, and after conditioning the grains are substantially randomly oriented.

8. The method of claim 1 characterized in that the stabilizing the copper surface by forming a copper oxide is by exposing the copper surface to an oxidant selected from sodium chlorite, hydrogen peroxide, permanganate, perchlorate, persulphate, ozone or mixtures thereof.

9. The method of claim 1 characterized in that the step of stabilizing the metal surface may be carried out at a temperature in the range of room temperature to about 80° C.

10. The method of claim 1 characterized in that the conditioning of the copper oxide layer is carried out at a temperature in the range of room temperature to about 50° C.

11. The method of claim 1 characterized in that the entire method is carried out for a time in the range of about 2 to 20 minutes.

12. The method of claim 1 characterized in that the one or more organic molecules is selected from a porphyrin, a porphyrinic macrocycle, an expanded porphyrin, a contracted porphyrin, a linear porphyrin polymer, a porphyrinic sandwich coordination complex, or a porphyrin array.

13. The method of claim 1 characterized in that the at least one attachment group comprises an alcohol or a phosphonate.

14. The method of claim 1 characterized in that the at least one attachment group comprises any one of more of: amines, alcohols, ethers, other nucleophile, phenyl ethynes, phenyl allylic groups, phosphonates and combinations thereof.

15. The method of claim 1 characterized in that the one or more organic molecules is a surface modifier moiety.

16. The method of claim 15 characterized in that the surface modifier moiety is selected from the group consisting of a macrocyclic proligand, a macrocyclic complex, a sandwich coordination complex and polymers thereof.

17. The method of claim 15 characterized in that the surface modifier moiety is comprised of a porphyrin.

18. The method of claim 15 characterized in that the one or more surface modifier moieties is selected from a porphyrin, a porphyrinic macrocycle, an expanded porphyrin, a contracted porphyrin, a linear porphyrin polymer, a porphyrinic sandwich coordination complex, a porphyrin array, a silane, a tetraorgano-silane, aminoethyl-aminopropyl-trimethoxysilane, (3-Aminopropyl)trimethoxysilane, (I-[3-(Trimethoxysilyl)propyl]urea), (3-Aminopropyl) triethoxysilane, ((3-Glycidyloxypropyl)trimethoxysilane), (3-Chloropropyl) trimethoxysilane, (3-Glycidyloxypropyl) trimethoxysilane, Dimethyldichlorosilane, 3-(Trimethoxysilyl)propyl methacrylate, Ethyltriacetoxysilane, Triethoxy (isobutyl)silane, Triethoxy(octyl) silane, Tris(2-methoxyethoxy)(vinyl)silane, Chlorotrimethylsilane, Methyltrichlorosilane, Silicon tetrachloride, Tetraethoxysilane, Phenyltrimethoxysilane, Chlorotriethoxysilane, ethylene-trimethoxysilane, an amine, a sugar or any combination of the above.

19. The method of claim 15 characterized in that the one or more surface modifier moieties is selected from the group consisting of molybdates, tungstates, tantalates, niobates, vanadates, isopoly or heteropoly acids of molybdenum, tungsten, tantalum, niobium, vanadium, and combinations of any of the foregoing.

20. The method of claim 1 characterized in that the one or more attachment group is comprised of an aryl functional group and/or an alkyl attachment group.

21. The method of claim 20 characterized in that the aryl functional group is comprised of a functional group selected from acetate, alkylamino, allyl, amine, amino, bromo, bromomethyl, carbonyl, carboxylate, carboxylic acid, dihydroxyphosphoryl, epoxide, ester, ether, ethynyl, formyl, hydroxy, hydroxymethyl, iodo, mercapto, mercaptomethyl, Se-acetylseleno, Se-acetylselenomethyl, S-acetylthio, S-acetylthiomethyl, selenyl, 4,4,5,5-tetramethyl-1,3,2-dioxaborolan-2-yl, 2-(trimethylsilyl)ethynyl, vinyl, and combinations thereof.

22. The method of claim 20 characterized in that the alkyl attachment group comprises a functional group selected from acetate, alkylamino, allyl, amine, amino, bromo, bromomethyl, carbonyl, carboxylate, carboxylic acid, dihydroxyphosphoryl, epoxide, ester, ether, ethynyl, formyl, hydroxy, hydroxymethyl, iodo, mercapto, mercaptomethyl, Se-acetylseleno, Se-acetylselenomethyl, S-acetylthio, S-acetylthiomethyl, selenyl, 4,4,5,5-tetramethyl-1,3,2-dioxaborolan-2-yl, 2-(trimethylsilyl)ethynyl, vinyl, and combinations thereof.

* * * * *